United States Patent
Jacob et al.

(10) Patent No.: US 9,349,658 B1
(45) Date of Patent: May 24, 2016

(54) METHODS OF FORMING FIN ISOLATION REGIONS ON FINFET SEMICONDUCTOR DEVICES USING AN OXIDATION-BLOCKING LAYER OF MATERIAL

(71) Applicants: GLOBALFOUNDRIES Inc., Grand Cayman (KY); International Business Machines Corporation, Armonk, NY (US)

(72) Inventors: Ajey Poovannummoottil Jacob, Watervliet, NY (US); Bruce Doris, Slingerlands, NY (US); Kangguo Cheng, Schenectady, NY (US); Ali Khakifirooz, Mountain View, CA (US); Kern Rim, Yorktown Heights, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/608,625

(22) Filed: Jan. 29, 2015

(51) Int. Cl.
*H01L 29/66* (2006.01)
*H01L 21/84* (2006.01)
*H01L 21/762* (2006.01)
*H01L 21/02* (2006.01)
*H01L 21/3105* (2006.01)
*H01L 21/311* (2006.01)

(52) U.S. Cl.
CPC .......... *H01L 21/845* (2013.01); *H01L 21/0214* (2013.01); *H01L 21/0217* (2013.01); *H01L 21/02164* (2013.01); *H01L 21/02233* (2013.01); *H01L 21/02255* (2013.01); *H01L 21/31053* (2013.01); *H01L 21/31111* (2013.01); *H01L 21/76202* (2013.01); *H01L 21/76224* (2013.01); *H01L 29/6656* (2013.01)

(58) Field of Classification Search
None
See application file for complete search history.

(56) References Cited

U.S. PATENT DOCUMENTS

| | | | | |
|---|---|---|---|---|
| 2005/0035391 | A1* | 2/2005 | Lee | H01L 21/26513 257/308 |
| 2010/0144121 | A1* | 6/2010 | Chang | H01L 29/7851 438/478 |
| 2010/0163971 | A1* | 7/2010 | Hung | H01L 29/66795 257/327 |
| 2013/0161729 | A1* | 6/2013 | Xie | H01L 29/66795 257/329 |

* cited by examiner

*Primary Examiner* — Charles Garber
*Assistant Examiner* — Steven Christopher
(74) *Attorney, Agent, or Firm* — Amerson Law Firm, PLLC

(57) ABSTRACT

One illustrative embodiment involves forming a plurality of trenches in a substrate so as to define a fin, forming a first oxidation-blocking layer of insulating material in the trenches so as to cover a portion, but not all, of the sidewalls of the lower portion of the fin, forming a second layer of insulating material above the first oxidation-blocking layer of insulating material, and performing a thermal anneal process to convert part, but not all, of the lower portion of the fin positioned above the first oxidation-blocking layer of insulating material into an oxide fin isolation region positioned under the fin.

16 Claims, 19 Drawing Sheets

US 9,349,658 B1

METHODS OF FORMING FIN ISOLATION REGIONS ON FINFET SEMICONDUCTOR DEVICES USING AN OXIDATION-BLOCKING LAYER OF MATERIAL

BACKGROUND OF THE INVENTION

1. Field of the Invention

Generally, the present disclosure relates to the manufacturing of semiconductor devices, and, more specifically, to various methods of forming fin isolation regions on FinFET semiconductor devices using an oxidation-blocking layer of material.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. One prior art technique for forming a Fin-FET device having such an arrangement is generally referred to as a BOTS (Bottom Oxidation Through STI) and will generally be described with reference to FIGS. 1A-1F.

FIG. 1A is a perspective view of an illustrative prior art FinFET semiconductor device 10 that is formed above a semiconductor substrate 12 at an intermediate point during fabrication. In this example, the FinFET device 10 includes three illustrative fins 14, an isolation material 15, a gate structure 18, sidewall spacers 20 and a gate cap layer 22. The fins 14 have a three-dimensional configuration: a height H, a width W and an axial length L. The portions of the fins 14 covered by the gate structure 18 are the channel regions of the FinFET device 10, while the portions of the fins 14 positioned laterally outside of the spacers 20 are part of the source/drain regions of the device 10. Although not depicted, the portions of the fins 14 in the source/drain regions may have additional epi semiconductor material formed thereon in either a merged or unmerged condition. In other applications, trenches may be formed in the portions of the fins 14 in the source/drain regions and an epi semiconductor material may be grown in the trenches so as to form embedded source/drain regions.

FIGS. 1B-1F depict one illustrative process flow for forming the fins 14 using the BOTS technique. FIG. 1B depicts the device 10 after several process operations were performed. First, a patterned hard mask layer 30, e.g., comprised of a patterned layer of silicon nitride (pad-nitride) and a patterned layer of silicon dioxide (pad-oxide), was formed above the substrate 12 in accordance with the desired fin pattern and pitch. Next, an etching process was performed through the patterned hard mask layer 30 so as to define full-depth fin-formation trenches 13 in the substrate 12 that define the fins 14. The fins 14 have a tapered configuration due to the nature of the etching process. The degree of tapering depicted in the drawings may be somewhat exaggerated relative to real-world devices. In general, the fins 14 are comprised of an upper portion having sidewalls 14V and a lower portion having tapered or flared sidewalls 14F.

FIG. 1C depicts the device 10 after several process operations were performed. First, a layer of insulating material 15, such as silicon dioxide, was formed so as to overfill the trenches 13. A chemical mechanical polishing (CMP) process was then performed to planarize the upper surface of the insulating material 15 with the top of the patterned hard mask 30.

FIG. 1D depicts the device 10 after several process operations were performed. First, an etch-back process was performed to recess the layer of insulating material 15 between the fins 14 and thereby expose at least a portion of the upper portions of the fins 14, which corresponds to the final fin height of the fins 14. Next, sidewall spacers 38 were formed adjacent the upper portion of the fins 14 above the recessed layer of insulating material 15.

FIG. 1E depicts the device after an anneal process was performed to oxidize the portions of the fins 14 that are not covered by the spacers 38. This results in the isolation material 15 that vertically separates the fins 14 from the substrate 12. As simplistically depicted in FIGS. 1A and 1E, the BOTS process creates a very uneven surface 12B in the substrate 12. Moreover, using the BOTS process, the thickness 15T of the insulation material 15 is generally relatively thick, e.g., 50-500 nm, and the thickness 15T of the insulation material 15 may vary from fin to fin due to the uneven surface 12B in the substrate 12. Additionally, the BOTS processing sequence is relatively complex and difficult to integrate in a mass production manufacturing environment. FIG. 1F is a TEM photograph showing the device made using the BOTS process.

The present disclosure is directed to various methods of forming fin isolation regions on FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fin isolation regions on FinFET semiconductor devices using an oxidation-blocking layer of material. One illustrative method disclosed herein includes, among other things, forming a plurality of trenches in a substrate so as to define a fin, forming a first oxidation-blocking layer of insulating material in the trenches so as to cover a portion, but not all, of the sidewalls of the lower portion of the fin, forming a second layer of insulating material above the first oxidation-blocking layer of insulating material, and performing a thermal anneal process to convert a part, but not all, of the lower portion of fin positioned above the first oxidation-blocking layer of insulating material into an oxide fin isolation region positioned under the fin.

In another example, a method disclosed herein involves, among other things, forming a plurality of fin-formation trenches in a semiconductor substrate so as to define a fin, forming a first layer of insulating material in the trenches so as to cover substantially all of the tapered sidewalls of the lower portion of the fin, forming a sidewall spacer on opposite sides of the upper portion of the fin above an upper surface of the first layer of insulating material, and removing the first layer of insulating material so as to expose the tapered sidewalls of the lower portion of the fin. In this example, the method further comprises, with the sidewall spacers in position, performing a fin-trimming etching process to remove at least a portion of the lower portion of the fin and to increase a depth of the fin-formation trenches so as to thereby define a plurality of increased-size trenches, forming a first oxidation-blocking layer of insulating material in the increased-size trenches such that a section of the lower portion of the fin is exposed between an upper surface of the first oxidation-blocking layer of insulating material and a bottom surface of the sidewall spacers, forming a second layer of insulating material above the first oxidation-blocking layer of insulating material and on and in contact with the exposed portion of the fin, and performing a thermal anneal process to convert the portion of the fin that is in contact with the third layer of insulating material and positioned above the first oxidation-blocking layer of insulating material into an oxide fin isolation region positioned under the fin.

In another example, a method disclosed herein involves, among other things, forming a plurality of fin-formation trenches in a semiconductor substrate so as to define a fin, forming a first oxidation-blocking layer of insulating material in the trenches so as to cover a portion, but not all, of the sidewalls of the lower portion of the fin, forming a first layer of insulating material in the trenches above the first oxidation-blocking layer of insulating material and on and in contact with a portion of the lower portion of the fin, and forming a sidewall spacer on opposite sides of the upper portion of the fin above an upper surface of the first layer of insulating material. In this example, the method further comprises forming a second layer of insulating material above the first layer of insulating material and adjacent the sidewall spacers and performing a thermal anneal process to convert the portion of the lower portion of the fin that is in contact with the first insulating material into an oxide fin isolation region positioned under the fin.

BRIEF DESCRIPTION OF THE DRAWINGS

The disclosure may be understood by reference to the following description taken in conjunction with the accompanying drawings, in which like reference numerals identify like elements, and in which.

Figure 1A:
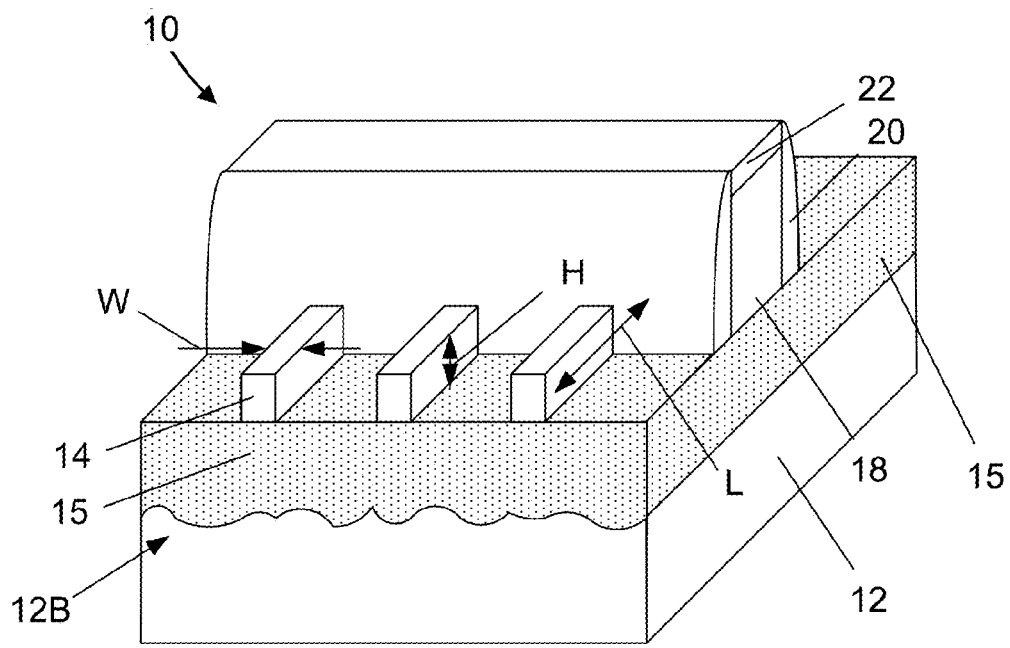
FIGS. 1A-1F depict one illustrative prior art method of forming fin isolation regions when forming FinFET semiconductor devices.
Figure 1B:
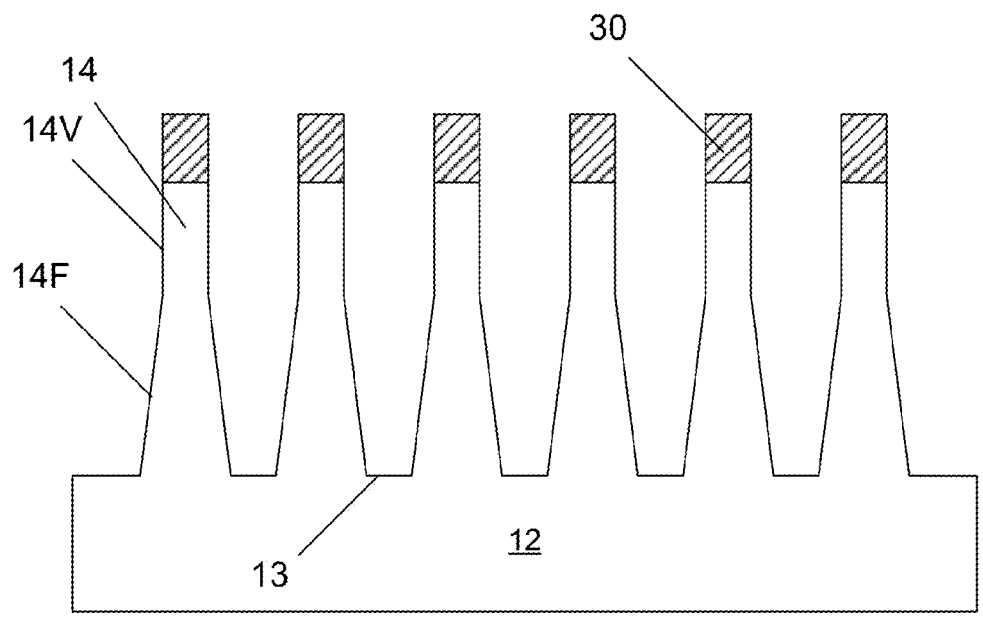
Figure 1C:
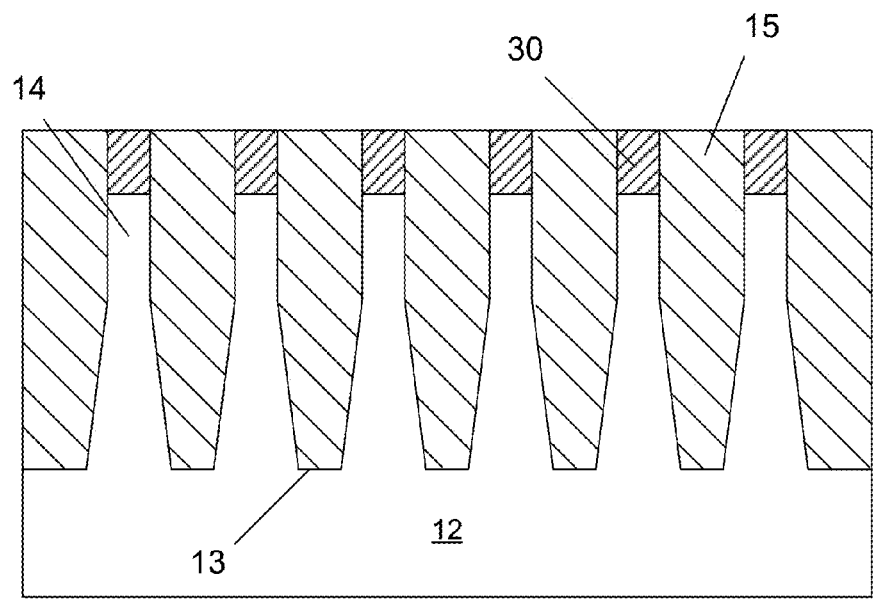
Figure 1D:
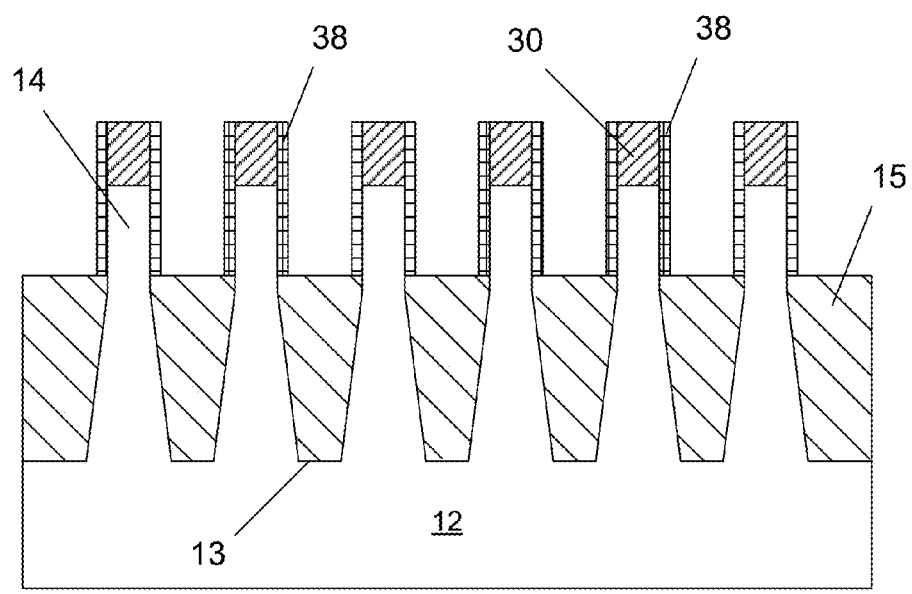
Figure 1E:
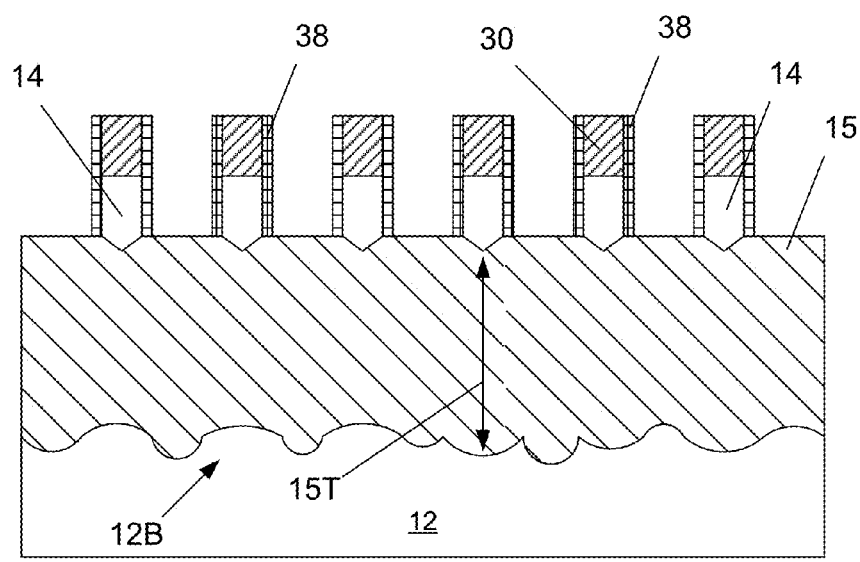

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming fin isolation regions on FinFET semiconductor devices using an oxidation-blocking layer of material. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

The integrated circuit products 100 depicted herein are formed in and on a semiconducting substrate 102, such as a bulk substrate. The substrate 102 may be made of silicon or it may be made of materials other than silicon. Thus, the terms "substrate" or "semiconducting substrate" should be understood to cover all forms of all semiconductor materials. As will be recognized by those skilled in the art after a complete reading of the present application, the illustrative integrated circuit product 100 may be comprised of a plurality of N-type FinFET devices and/or a plurality of P-type FinFET devices.

As will be appreciated by those skilled in the art after a complete reading of the present application, various doped regions, e.g., source/drain regions, halo implant regions, well regions and the like, for the devices are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 1F:
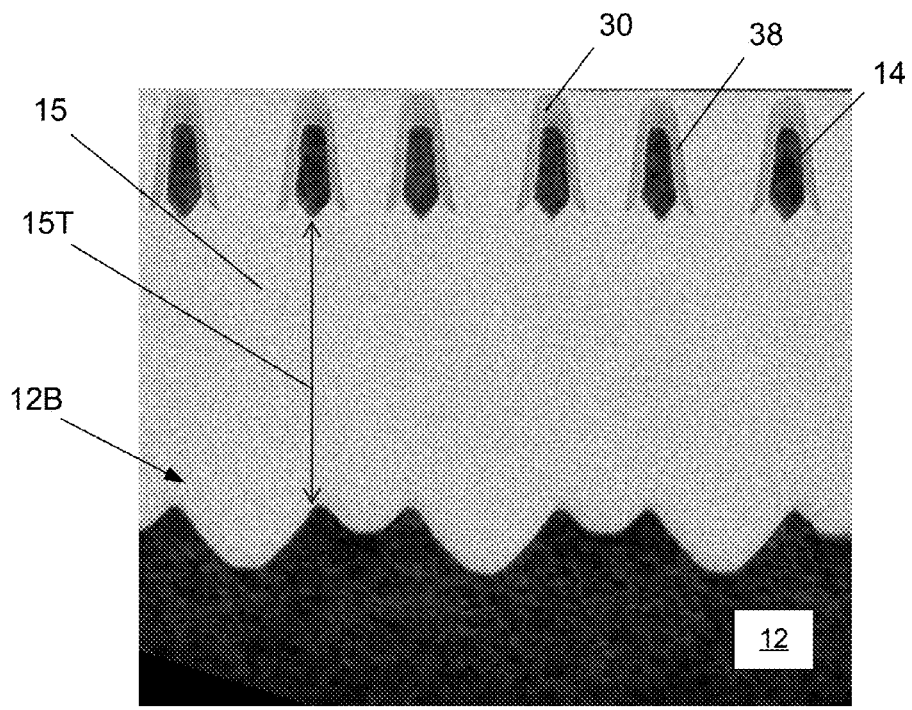
Figure 2A:
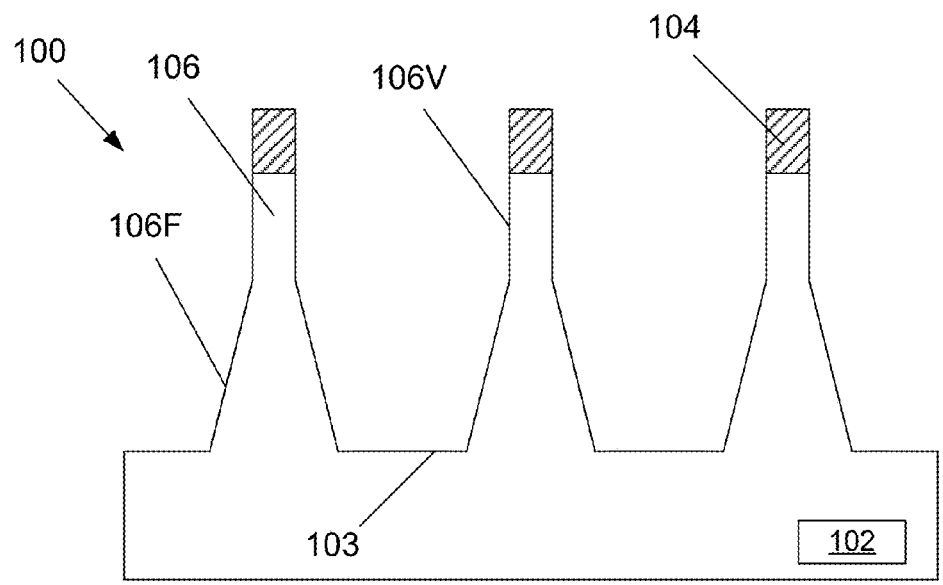
FIGS. 2A-2I depict one illustrative method disclosed herein of forming fin isolation regions for FinFET semiconductor devices.

FIGS. 2A-2I depict one illustrative method disclosed herein of forming fin isolation regions for FinFET semiconductor devices. FIG. 2A depicts the product 100 after an etching process was performed through a patterned hard mask layer 104 so as to define a plurality of fin-formation trenches 103 in the substrate 102 that define three illustrative fins 106. The fins 106 have a tapered configuration due to the nature of the etching process. The degree of tapering depicted in the drawings may be somewhat exaggerated relative to real-world devices so as to facilitate explanation of the inventions disclosed herein. In general, the fins 106 are comprised of a first portion having sidewalls 106V and a second portion having tapered or flared sidewalls 106F. Of course, the sidewalls 106V may be substantially vertical or may exhibit some degree of tapering, as reflected in the fins shown in the TEM picture shown in FIG. 1F. The fins 106 may be formed to any desired pitch pattern and they may have any desired width. The depth of the fin-formation trenches 103 may also vary depending upon the application. The patterned etch mask 104 is intended to be representative of any type of patterned masking layer that may be used when forming fins in a substrate, and it may be comprised of one or more layers of material, e.g., a combination of a pad oxide layer and a pad nitride layer.

Figure 2B:
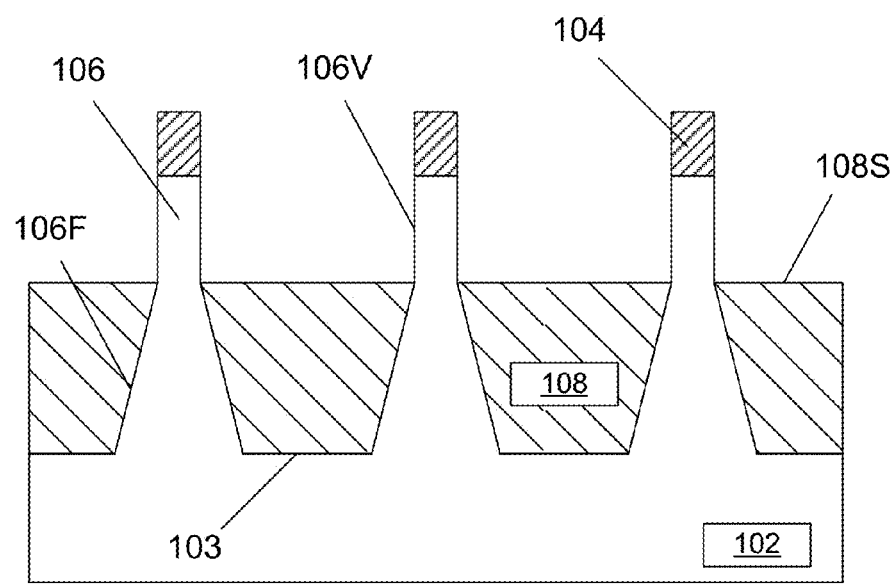

FIG. 2B depicts the product 100 after a layer of insulating material 108, such as an HDP silicon dioxide material, was formed between the trenches 103 such that its upper surface 108S is positioned so as to cover the flared sidewalls 106F of the fins 106 while leaving most, if not all, of the sidewalls 106V of the fins exposed. In one example, the layer of insulating material 108 may be formed by performing a deposition process wherein the surface 108S is an as-deposited surface. In another example, the layer of insulating material 108 may be initially deposited so as to overfill the trenches 103; a chemical mechanical polishing (CMP) process may then be performed to planarize the upper surface of the insulating material 108 with the top of the patterned hard mask 104; and a recess ("etch-back") etching process was performed to recess the layer of insulating material 108 between the fins 106 and thereby expose the upper portions of the fins 106.

Figure 2C:
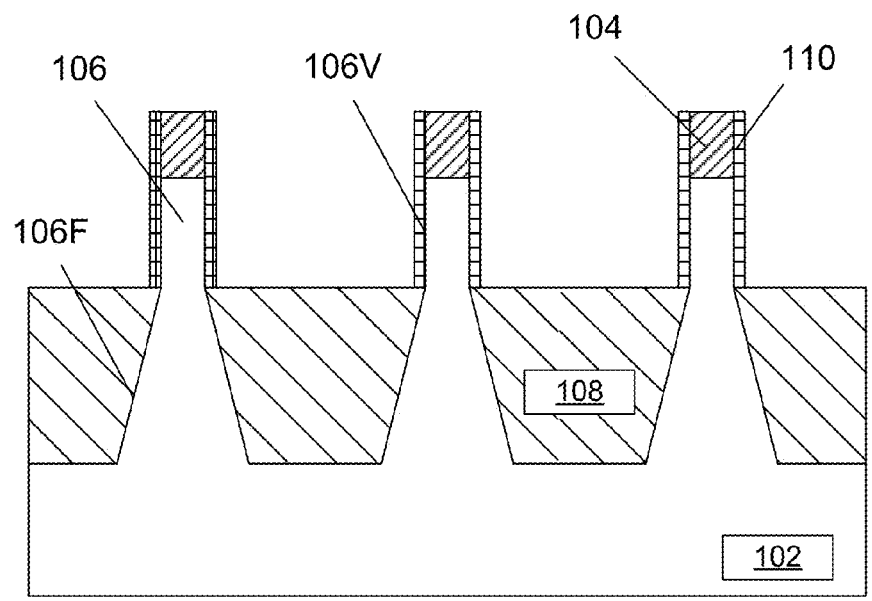

FIG. 2C depicts the product 100 after simplistically depicted sidewall spacers 110 were formed adjacent the exposed upper portion of the fins 106 and the patterned masking layer 104. The spacers 110 may be of any desired lateral width (e.g., 3-20 nm), and they may be comprised of a variety of different materials, e.g., silicon nitride. The spacers 110 may be formed by performing a conformal deposition process to deposit a layer of spacer material and thereafter performing an anisotropic etching process.

Figure 2D:
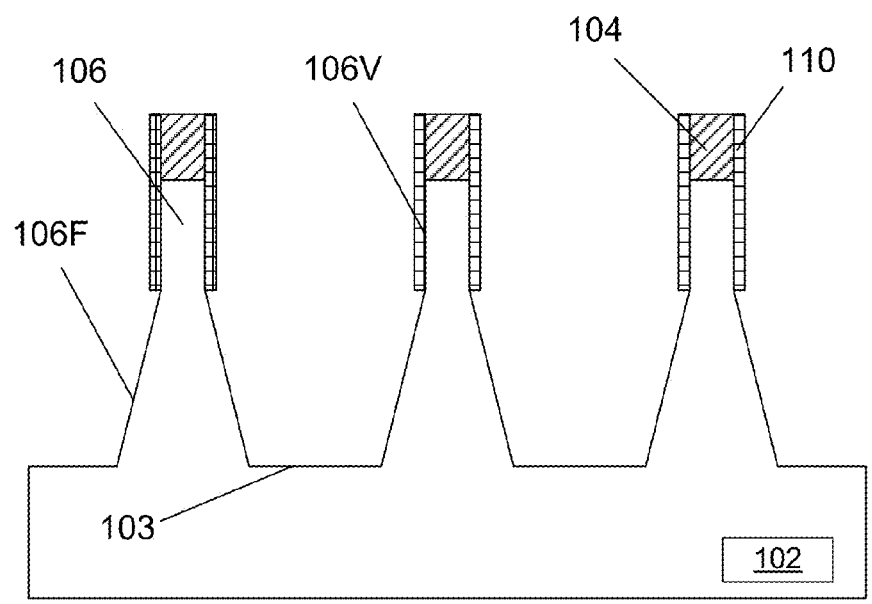

FIG. 2D depicts the product 100 after the layer of insulating material 108 was selectively removed relative to the surrounding structures.

Figure 2E:
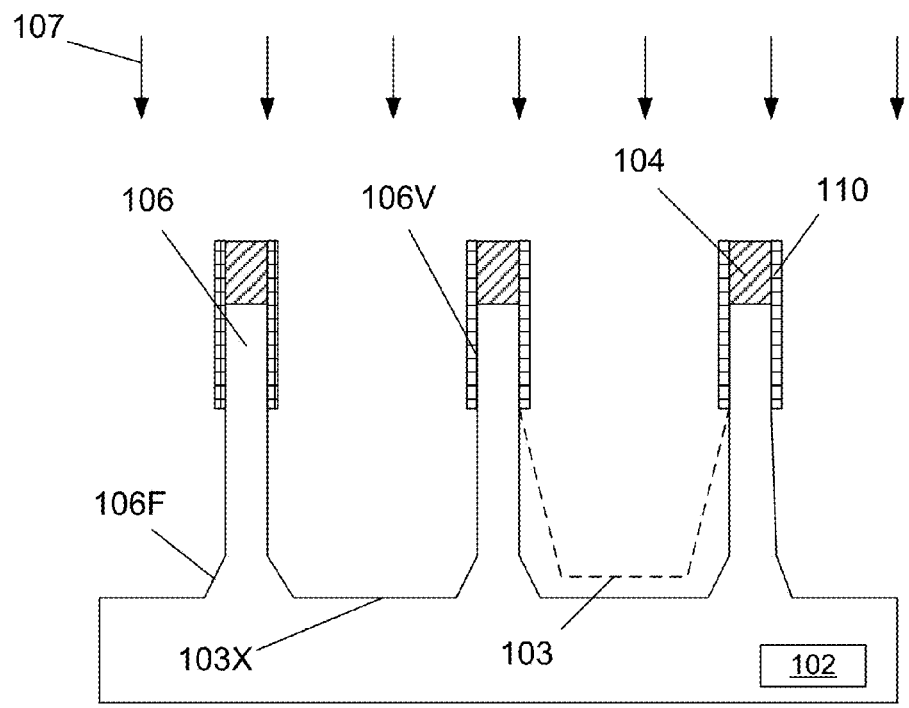

FIG. 2E depicts the product 100 after a fin-trimming etching process 107, e.g., a dry silicon etching process that exhibits some isotropic characteristics, was performed to remove at least some portions of the lower tapered sidewalls 106F of the fins 106. This fin-trimming etching process 107 also increases the original depth and original width of the initial fin-formation trenches 103 and thereby results in the formation of enlarged trenches 103X. An outline of the original fin-formation trenches 103 is depicted in a dashed line in FIG. 2E. In one embodiment, the fin-trimming etching process 107 may be an etching process sequence that includes a first portion that is primarily anisotropic in nature followed by a second portion that is primarily isotropic in nature, or vice-versa. The amount or magnitude of the material removed during this fin-trimming etching process 107 may vary depending upon the particular application and the amount of the flared sidewalls 106F of the fins 106 that is desired to be removed. The fin-trimming etching process 107 be separate from or incorporated as part of the initial etching sequence (typically an RIE process) that is performed to initially define the fins (see FIG. 2D). If the fin-trimming etching process 107 is performed in a separate step after the fins 106 are initially formed, a dry or wet etch process can be used.

Figure 2F:
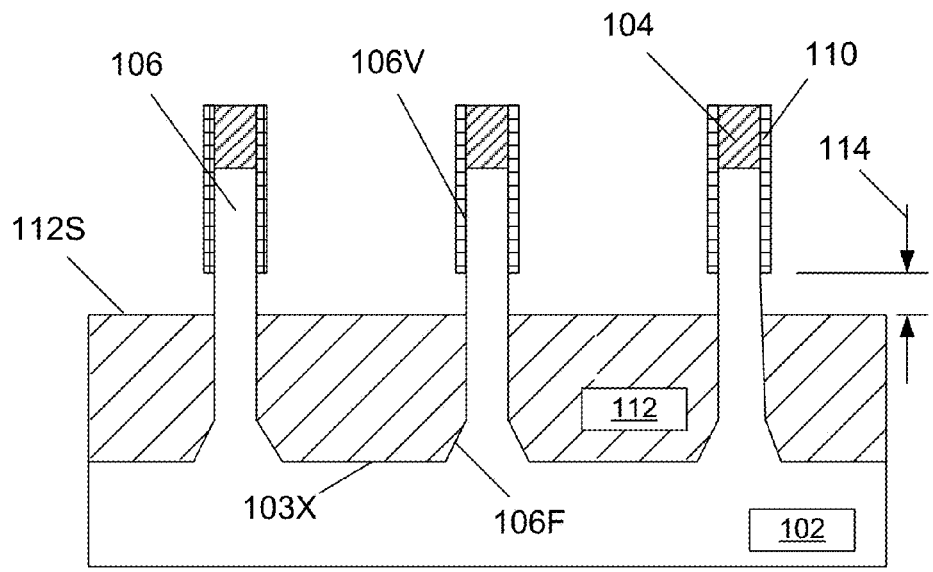

FIG. 2F depicts the product 100 after a layer of insulating material 112, such as an HDP silicon nitride material or silicon oxynitride material, was deposited between the trenches 103X such that its upper surface 112S is positioned so as to leave a portion of the fin 106 between the upper surface 112S and the bottom surface of the spacers 110 exposed. Some of the material of the layer 112 may also form on the upper surface of the hardmask layer 104, but that situation is not depicted in the drawings. The layer of insulating material 112 will essentially act as an oxidation-blocking layer to prevent oxidation of the portions of the fin 106 that are below the upper surface 112S of the layer 112. As will be described more fully below, the distance 114 will essentially define the thickness (or height) of an oxide fin isolation material to be formed for each fin 106.

Figure 2G:
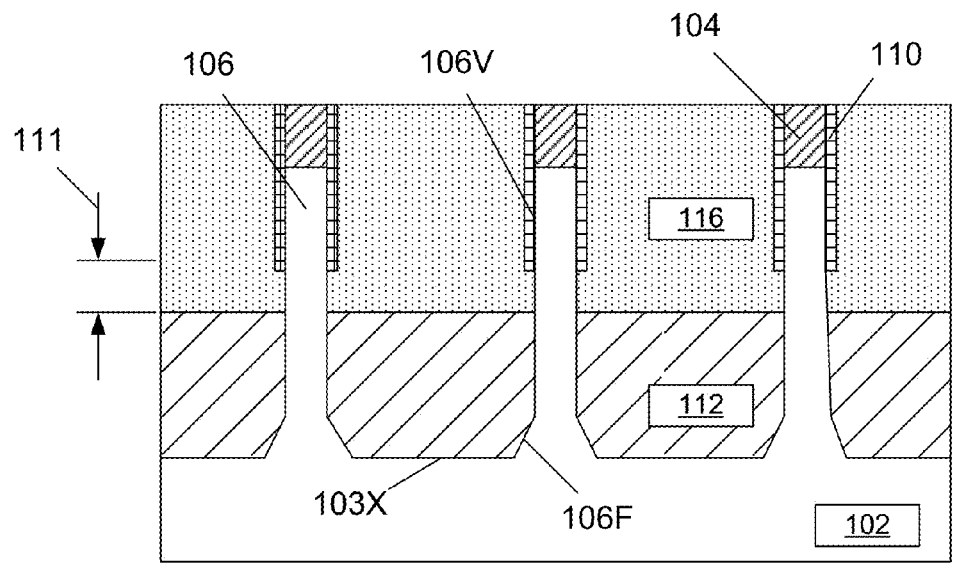

FIG. 2G depicts the product 100 after another layer of insulating material 116, such as silicon dioxide, was formed between the fins 106 so as to overfill the remaining portion of the trenches 103X above the layer of insulating material 112, and after a chemical mechanical polishing (CMP) process was performed to planarize the upper surface of the insulating material 116 with the top of the patterned hard mask 104. Although not depicted, if desired, an ion implantation process may be performed to introduce a oxidation-enhancing material, such as fluorine, oxygen or carbon, into the layer of insulating material 116 in the region 111. In one illustrative embodiment, where fluorine is implanted, the oxidation-enhancing implant process may be performed using a dose of about $1E13$-$1E15$ ions/cm$^2$ and an implant energy of about 30-100 keV.

Figure 2H:
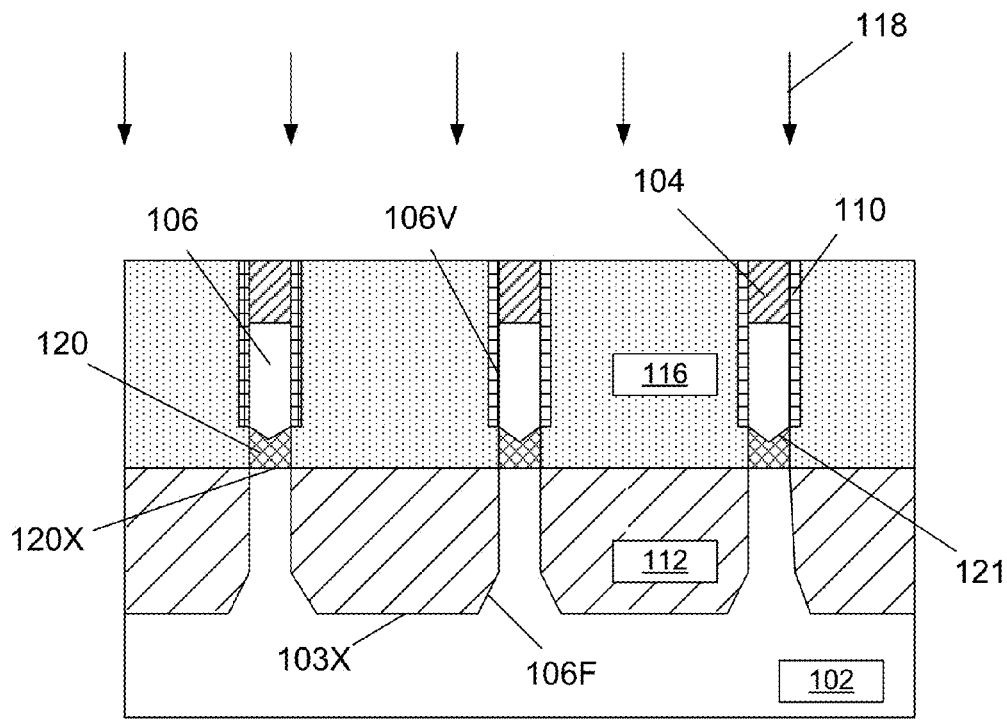

FIG. 2H depicts the product 100 after a thermal anneal process 118 was performed on the product 100 so as to form oxide fin isolation regions 120 under each of the fins 106. In general, the thermal anneal process 118 is performed under conditions such that substantially all of the exposed portion of the fin 106 between the bottom of the spacers 110 and the top of the layer of insulating material 112 is converted into an insulating material, e.g., fin isolation regions 120 comprised of silicon dioxide. The downward-facing faceted end 121 on the bottom of the fin 106 is due to the crystallographic orientation of the substrate 102. The parameters of the thermal anneal process 118 may vary depending upon the particular application. In one illustrative embodiment, the thermal anneal process 118 may be performed at a temperature that falls within the range of about 400-1300° C. in an oxidizing processing ambient (wet or dry). In some cases, the thermal anneal process 118 may be performed in an open-air furnace. The thermal anneal process 118 may be performed using an RTA furnace, a laser anneal process or a traditional furnace, depending upon the particular application. The duration of the thermal anneal process 118 may vary depending upon a variety of factors, e.g., it may range from nanoseconds to hours depending upon the particular processing tools and techniques used to perform the anneal process 118, such as an RTA chamber or a traditional furnace. Additionally, the rate of oxidation may be controlled or "tuned" by controlling the thickness of the layer of insulating material 116. It is anticipated that, in all cases, the layer of insulating material 116 will be deposited such that its upper surface is positioned above the exposed portion of the fins 106. In general, the layer of insulating material 116 should be deposited such that its upper surface is positioned approximately level with to a few hundred nanometers above the bottom of the spacers 110, depending upon downstream planarization and the oxide recess scheme. However, to control the rate of oxidation, the layer of insulating material 116 may be deposited to an even greater thickness (as shown in FIG. 2H) to reduce the rate of oxidation of the exposed portions of the fins 106.

Note that the above methodology, as well as the other methods disclosed herein, result in relatively thin oxide fin isolation regions 120 having a substantially planar bottom surface 120X, unlike the uneven surface 12B of the substrate 12 that results when oxidizing portions of the fin using the prior art methodology described in the background section of this application. Additionally, in the embodiments disclosed herein that involve deposition of the layer 112, the position of the upper surface 112S of the layer 112 may be very precisely controlled, which provides a means of controlling the final thickness of the oxide fin isolation regions 120. In the embodiments disclosed herein, wherein an oxidation-retarding ion implant process is performed so as to essentially define the approximate location of the bottom surface 120X of the oxide fin isolation regions 120, as described more fully below, the thickness of the oxide fin isolation regions 120 can be more precisely controlled relative to prior art techniques.

Figure 2I:
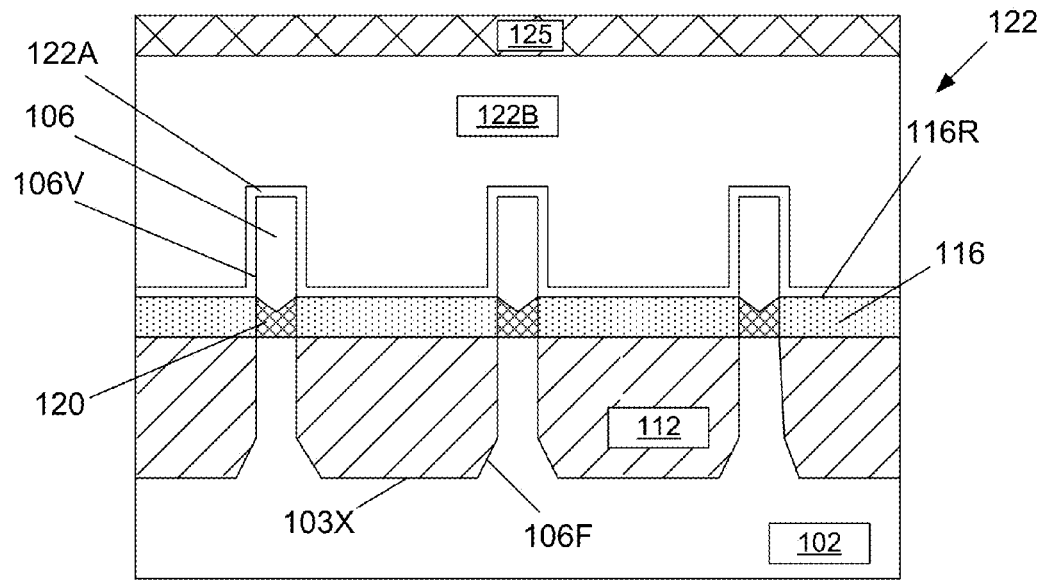

At this point in the process flow, traditional manufacturing techniques may be performed to complete the fabrication of the FinFET devices for the product 100. FIG. 2I depicts the product 100 after several process operations were performed. First, a recess ("etch-back") etching process was performed to recess the layer of insulating material 116 between the fins 106 such that it has a recessed upper surface 116R that exposes the desired final height of the fins 106. Next, one or more etching processes were performed to remove the patterned mask layer 104 and the spacers 110 and thereby expose the upper portions of the fins 106. At this point, gate structures (either final or dummy gates structures) may be formed for the FinFET devices. Accordingly, FIG. 2I depicts an illustrative and schematic gate structure 122 and gate cap layer 125 for the FinFET device. In one illustrative embodiment, the schematically depicted gate structure 122 includes an illustrative gate insulation layer 122A and an illustrative gate electrode 122B. The gate structure 122 may be formed using so-called gate-first or replacement gate techniques, all of which are well known to those skilled in the art. The gate insulation layer 122A may be comprised of a variety of different materials, such as, for example, a so-called high-k (k value greater than 10) insulation material (where k is the relative dielectric constant), etc. Similarly, the gate electrode 122B of the gate structure 122 may be comprised of polysilicon or one or more metal layers that act as the gate electrode. As will be recognized by those skilled in the art after a complete reading of the present application, the gate structure 122 depicted in the drawings, i.e., the gate insulation layer and the gate electrode, is intended to be representative in nature. That is, the gate structure 122 may be comprised of a variety of different materials and it may have a variety of configurations. The gate cap layer 125 may be comprised of a variety of materials, such as silicon nitride.

Figure 3A:
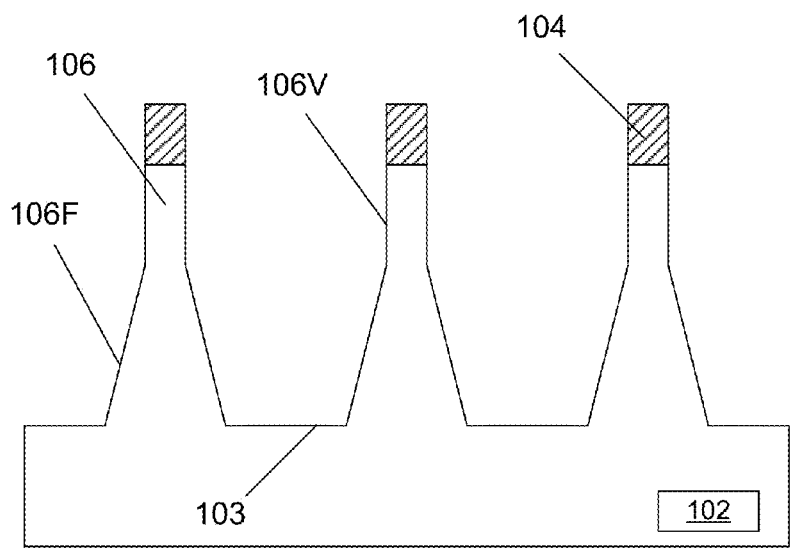
FIGS. 3A-3G depict another illustrative method disclosed herein of forming fin isolation regions for FinFET semiconductor devices.

FIGS. 3A-3G depict another illustrative method disclosed herein of forming fin isolation regions for FinFET semiconductor devices. FIG. 3A depicts the product 100 at a point in fabrication that corresponds to that shown in FIG. 2A, i.e., the illustrative fins 106 have been formed in the substrate 102.

Figure 3B:
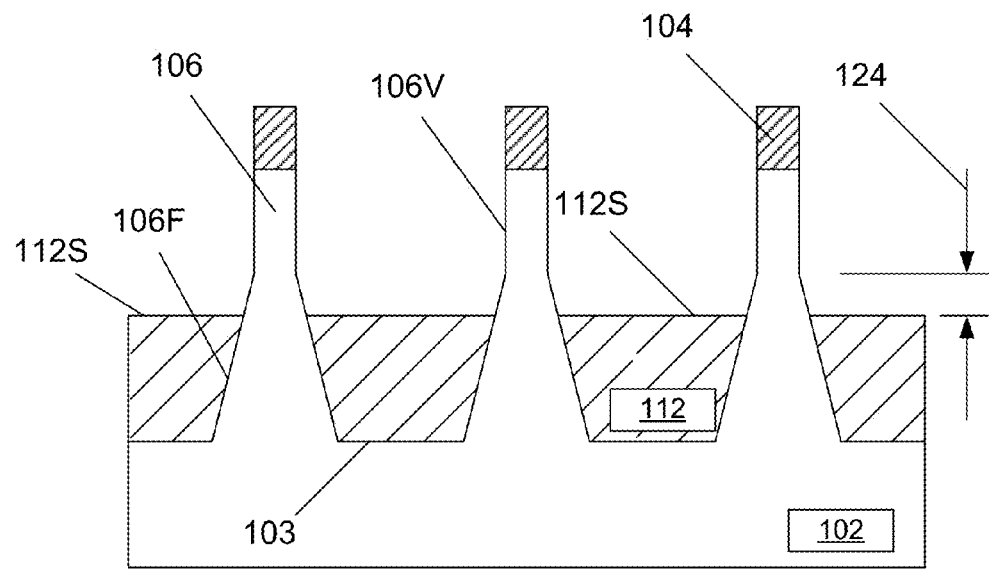

FIG. 3B depicts the product 100 after the above-described layer of insulating material 112, such as an HDP silicon nitride material, was formed in the trenches 103 between the fins 106 such that its upper surface 112S is positioned so as to leave a portion of the tapered sidewalls 106F exposed. As before, the layer of insulating material 112 will essentially act to prevent oxidation of the portions of the fin 106 that are below the upper surface 112S of the layer 112. In this embodiment, the distance 124 between the upper surface 112S of the layer of insulating material 112 and the more vertical sidewall portions 106V of the fins 106 will define the thickness (or height) of the above-described oxide fin isolation regions 120.

Figure 3C:
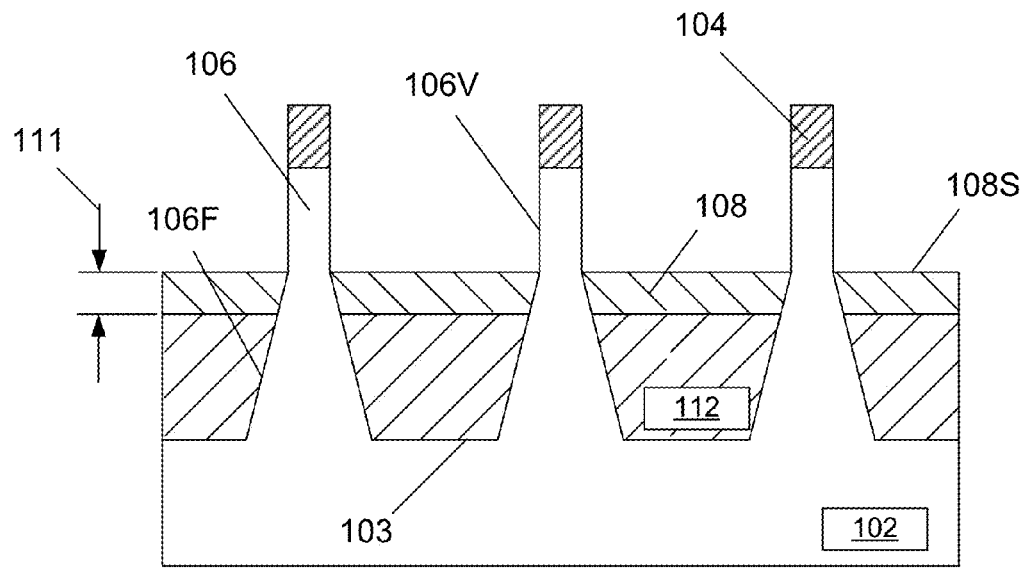

FIG. 3C depicts the product 100 after the above-described layer of insulating material 108, such as an HDP silicon dioxide material, was formed in the trenches 103 above the layer of insulating material 112. The upper surface 108S of the layer of insulating material 108 is positioned so as to cover the exposed flared sidewalls 106F of the fins 106 while leaving most, if not all, of the sidewalls 106V of the fins 106 exposed. As before, the layer of insulating material 108 may be formed in such a manner that the surface 108S is an as-deposited surface, or it may be formed by performing a process sequence that involves over-filling the trenches 103, performing a CMP process that stops on the patterned hard mask 104, and performing a recess ("etch-back") etching process to recess the layer of insulating material 108 between the fins 106 and thereby expose the upper portions of the fins 106. Moreover, if desired, the above-described oxidation-enhancing ion implantation process may be performed to introduce an oxidation-enhancing material into the layer of insulating material 108 in the region 111.

Figure 3D:
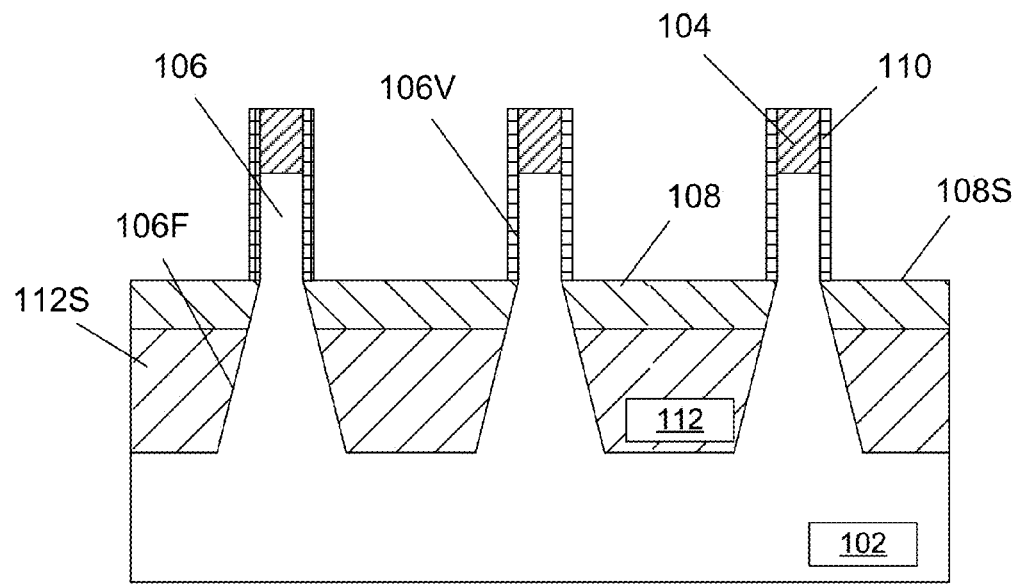

FIG. 3D depicts the product 100 after the above-described sidewall spacers 110 were formed adjacent the exposed upper portion of the fins 106 and the patterned masking layer 104.

Figure 3E:
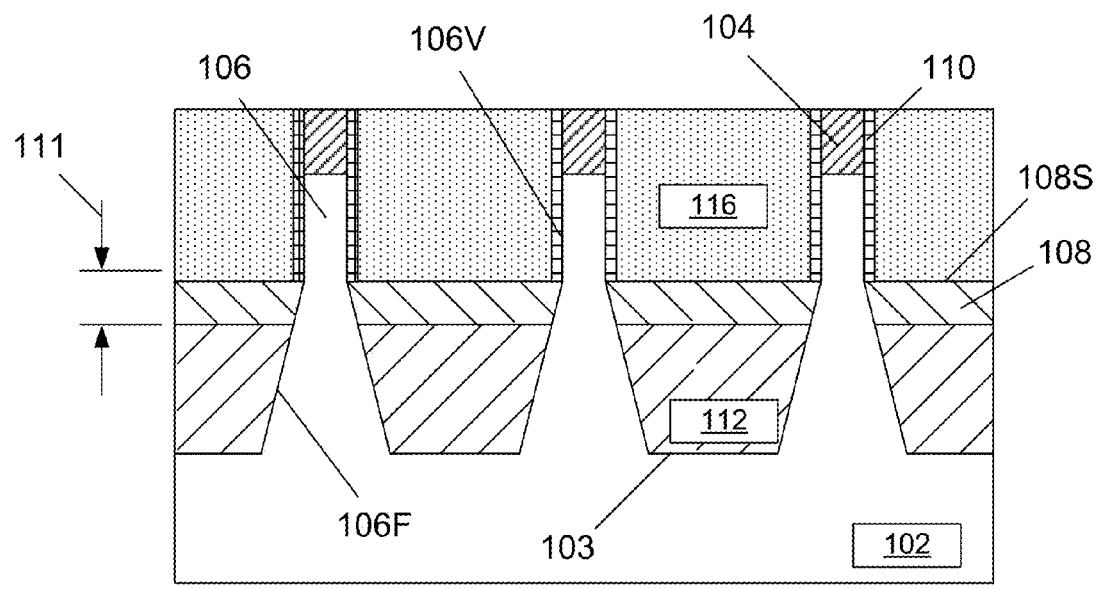

FIG. 3E depicts the product 100 after several process operations were performed. First, the above-described layer of insulating material 116, such as silicon dioxide, was deposited so as to overfill the remaining portion of the trenches 103 above the layer of insulating material 108. Then, a CMP process was performed to planarize the upper surface of the insulating material 116 with the top of the patterned hard mask 104. If desired, the above-described oxidation-enhancing ion implantation process may be performed at this point in the process flow to introduce the oxidation-enhancing material into the layer of insulating materials 116/108 in the region 111.

Figure 3F:
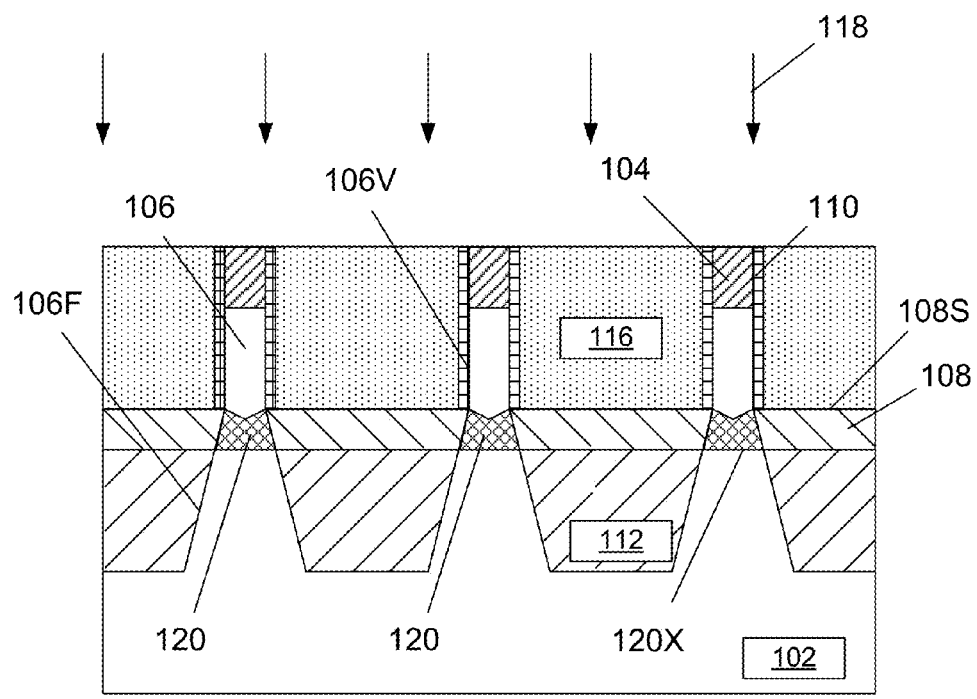

FIG. 3F depicts the product 100 after the above-described thermal anneal process 118 was performed on the product 100 so as to form oxide fin isolation regions 120 under each of the fins 106.

Figure 3G:
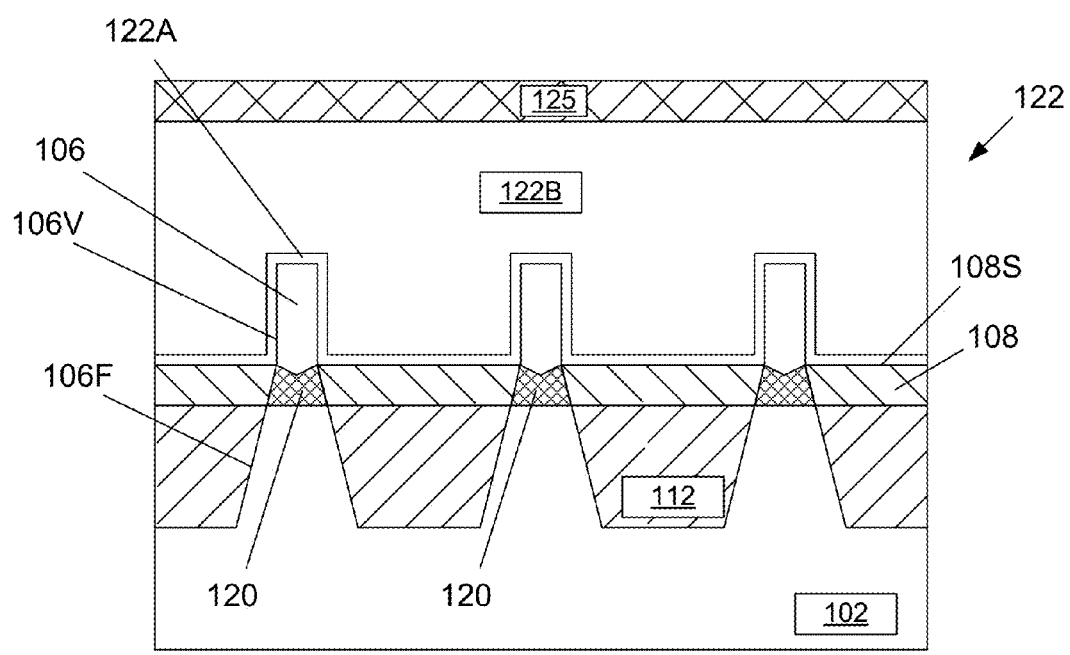

At this point in the process flow, traditional manufacturing techniques may be performed to complete the fabrication of the FinFET devices for the product 100. FIG. 3G depicts the product 100 after several process operations were performed. First, a recess ("etch-back") etching process was performed to remove all (the depicted situation) or at least some of the layer of insulating material 116 between the fins 106 so as to expose the desired final height of the fins 106. Next, one or more etching processes were performed to remove the patterned mask layer 104 and the spacers 110 and thereby expose the upper portions of the fins 106. At this point, the above-described gate structures 122 (either final or dummy gates structures) and gate cap layer 125 may be formed for the FinFET devices.

Figure 4A:
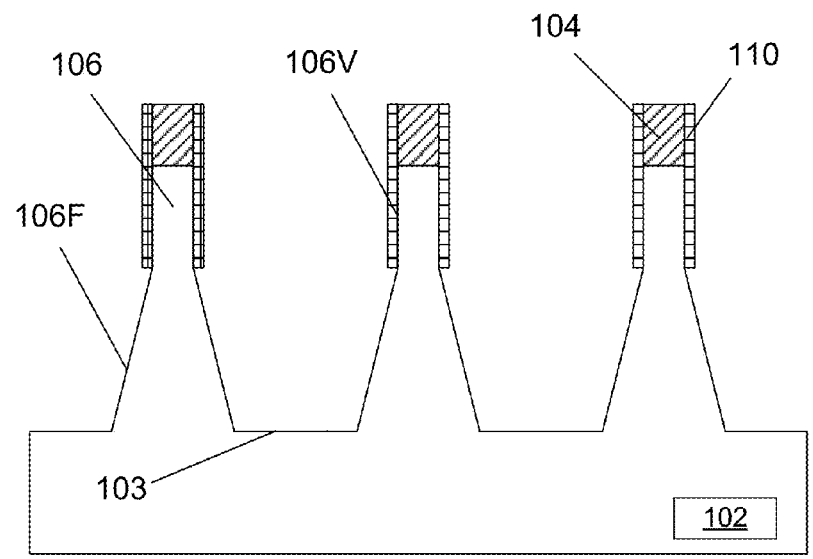
FIGS. 4A-4E depict an additional illustrative method disclosed herein of forming fin isolation regions for FinFET semiconductor devices.

FIGS. 4A-4E depict yet another illustrative method disclosed herein of forming fin isolation regions for FinFET semiconductor devices. FIG. 4A depicts the product 100 at a point in fabrication that corresponds to that shown in FIG. 2D, i.e., after the illustrative fins 106 were formed in the substrate 102 and after the sidewall spacers 110 were formed.

Figure 4B:
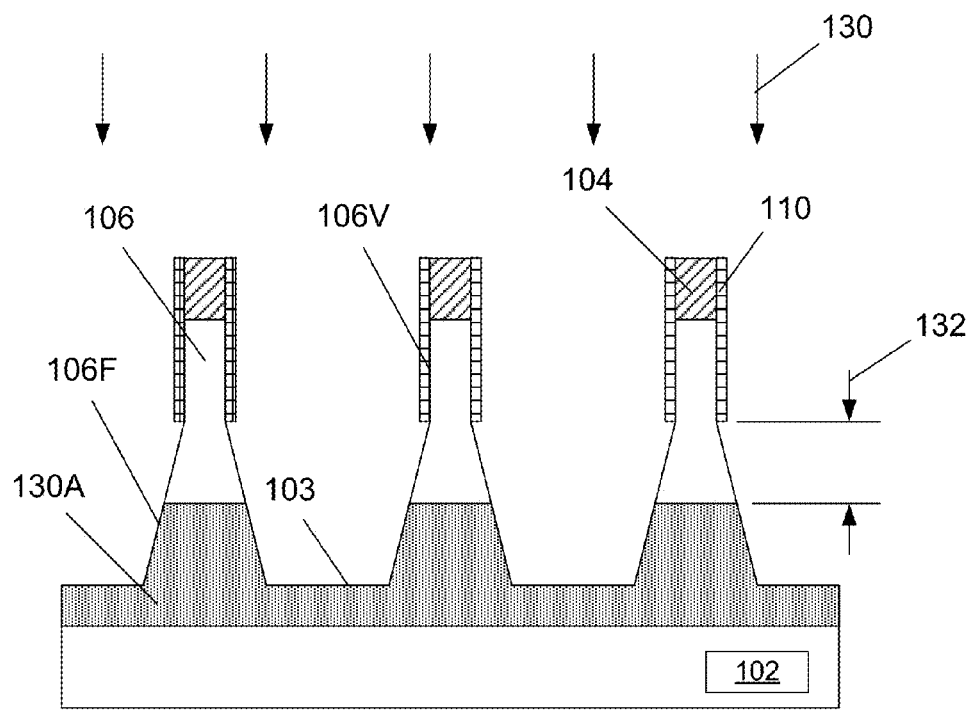

FIG. 4B depicts the product 100 after an ion implantation process 130 was performed to form implant regions 130A in the tapered portions 106F of the fins and perhaps a portion of the substrate 102. The implantation process 130 is performed so as to implant an oxidation-retarding material, such as nitrogen, argon, xenon, etc., into the flared portions 106F of the fins 106 (and perhaps the substrate 102) so as to thereby reduce the rate of oxidation for the implanted material as compared to the starting material for the fins 106. As a result of this process, the implant region 130A is positioned in a lower section of the lower portion (having tapered sidewalls 106F) of the fin 106, while an upper section of the lower portion of the fin 106 is substantially free of the implanted material. The upper portion of the fin 106 remains covered by the spacers 110 during this oxidation-retarding implantation process. The implant material, the implant energy and implant dose may vary depending upon the particular material implanted and the particular application. In one illustrative embodiment, where nitrogen is implanted, the implant dose may be about $1E13-1E15$ ions/cm$^2$ and the implant energy may be about 30-150 keV. As will be described more fully below, the distance 132 between the upper surface of the implant region 130A and the bottom of the spacers 110 will correspond approximately to the thickness (or height) of the above-described oxide fin isolation regions 120, in that some of the implant regions 130A will be consumed in the oxidation process, albeit at a slower oxidation rate than that of non-implanted regions.

Figure 4C:
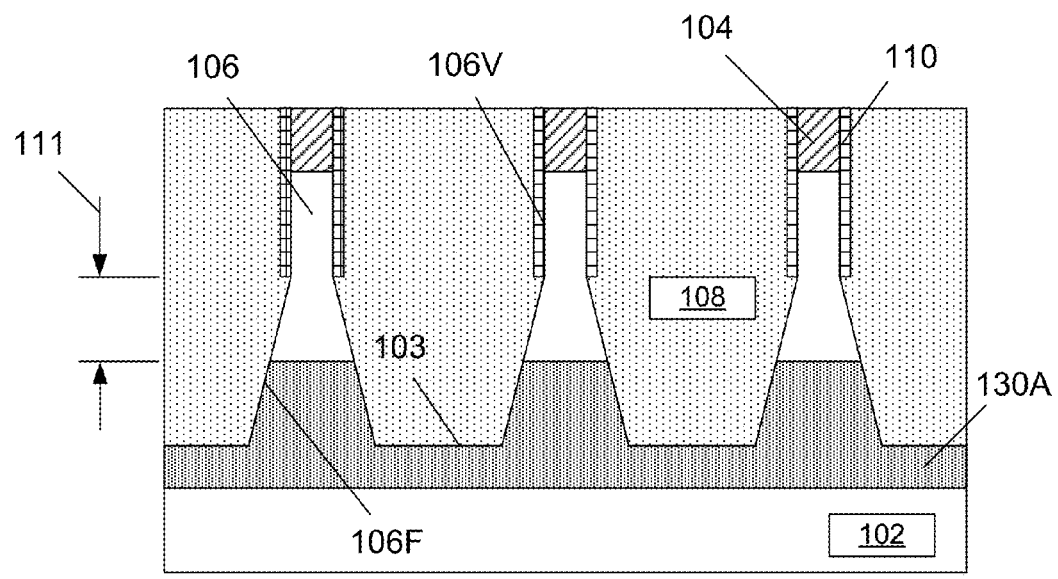

FIG. 4C depicts the product 100 after the above-described layer of insulating material 108, such as an HDP silicon dioxide material, was formed in the trenches 103 between the fins 106. The layer of insulating material 108 was initially formed so that it over-filled the trenches 103. Thereafter, a CMP process was performed that stopped on the patterned hard mask 104. Moreover, if desired, the above-described oxidation-enhancing ion implantation process may be performed to introduce an oxidation-enhancing material into the layer of insulating material 108 in the region 111.

Figure 4D:
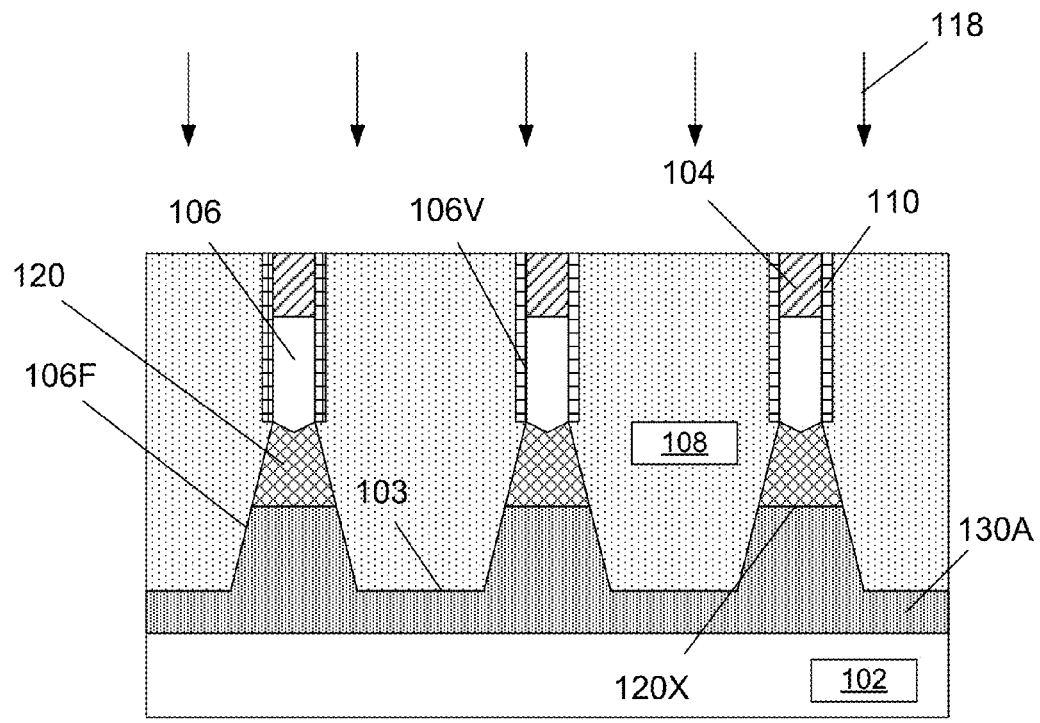

FIG. 4D depicts the product 100 after the above-described thermal anneal process 118 was performed on the product 100 so as to form oxide fin isolation regions 120 under each of the fins 106.

Figure 4E:
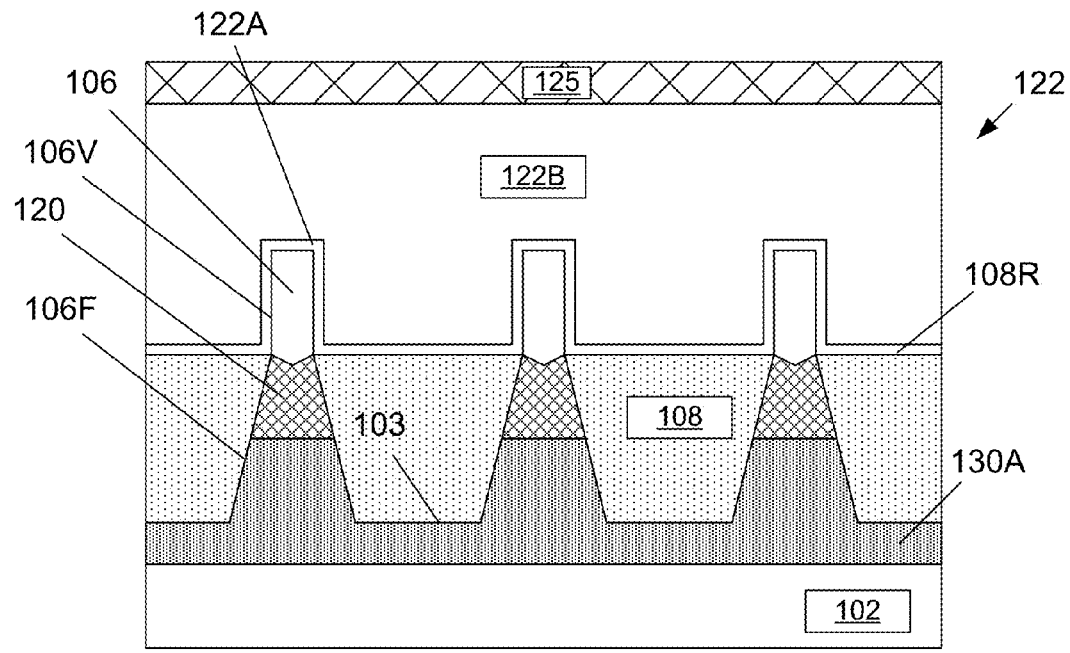

At this point in the process flow, traditional manufacturing techniques may be performed to complete the fabrication of the FinFET devices for the product 100. FIG. 4E depicts the product 100 after several process operations were performed. First, a recess ("etch-back") etching process was performed to recess the layer of insulating material 108 between the fins 106 so as to expose the desired final height of the fins 106. Next, one or more etching processes were performed to remove the patterned mask layer 104 and the spacers 110 and thereby expose the upper portions of the fins 106. At this point, the above-described gate structures 122 (either final or dummy gates structures) and gate cap layer 125 may be formed for the FinFET devices.

Figure 5A:
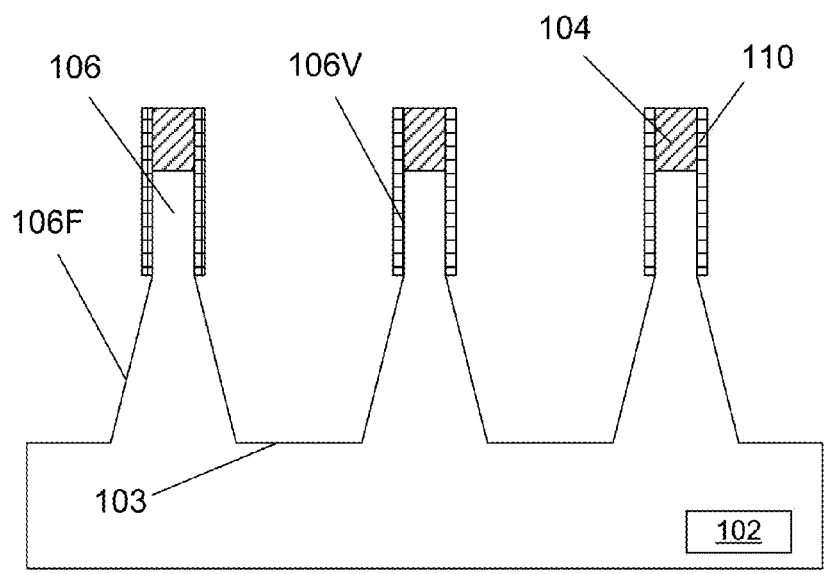
FIGS. 5A-5E depict yet another illustrative method disclosed herein of forming fin isolation regions for FinFET semiconductor devices.

FIGS. 5A-5E depict yet another illustrative method disclosed herein of forming fin isolation regions for FinFET semiconductor devices. FIG. 5A depicts the product 100 at a point in fabrication that corresponds to that shown in FIG. 2D, i.e., after the illustrative fins 106 were formed in the substrate 102 and after the sidewall spacers 110 were formed.

Figure 5B:
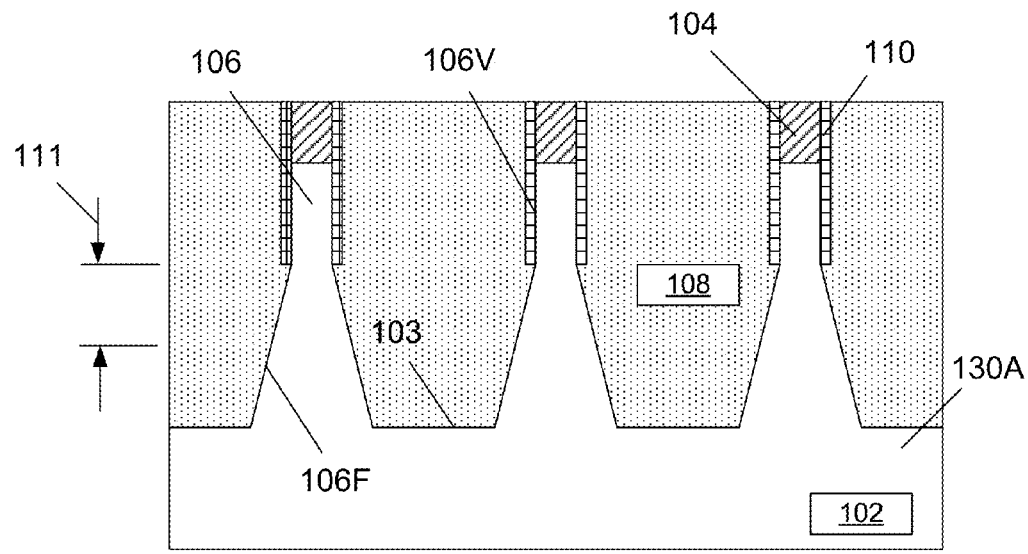

FIG. 5B depicts the product 100 after the above-described layer of insulating material 108, such as an HDP silicon dioxide material, was formed in the trenches 103 between the fins 106. The layer of insulating material 108 was initially formed so that it over-filled the trenches 103. Thereafter, a CMP process was performed that stopped on the patterned hard mask 104.

Figure 5C:
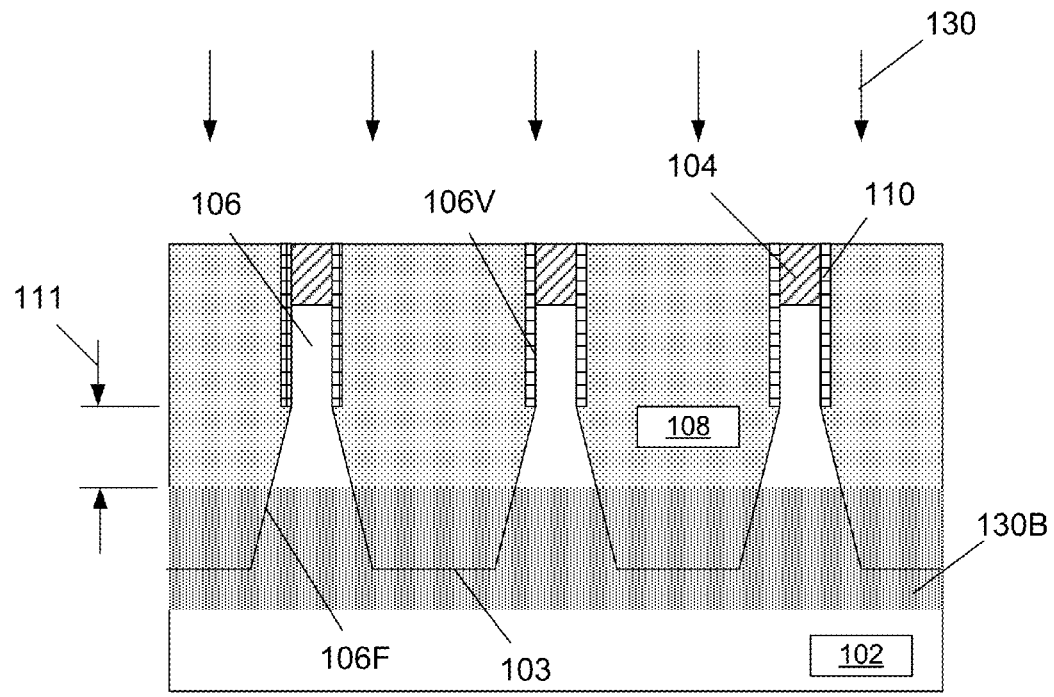

FIG. 5C depicts the product 100 after the above-described oxidation-retarding implantation process 130 was performed to form implant regions 130B in the tapered portions 106F of the fins 106, the layer of insulating material 108 and perhaps a portion of the substrate 102. As before, as a result of this process, the implant region 130B is positioned in a lower section of the lower portion (having tapered sidewalls 106F) of the fin 106, but not in an upper section of the lower portion of the fin 106. Stated another way, the oxidation-retarding implantation process 130 is performed so as to implant the oxidation-retarding material into the lower section of the lower portion of the fins 106 (and perhaps the substrate 102) so as to thereby reduce the rate of oxidation of the lower section of the lower portion of the fin 106 as compared to the upper section of the lower portion of the fin 106, i.e., the portion of the fin positioned between the upper surface of the implant region 130B and the bottom surface of the spacers 110 is substantially free of the implanted material. As before, the distance between the upper surface of the implant region 130B and the bottom of the spacers 110 will correspond approximately to the thickness (or height) of the above-described oxide fin isolation regions 120. Moreover, if desired, the above-described oxidation-enhancing ion implantation process may be performed at the point of the process flow depicted in either FIG. 5B or 5C to introduce an oxidation-enhancing material into the layer of insulating material 108 in the region 111. Of course, the above-described oxidation-enhancing ion implantation process and the oxidation-retarding implantation process may be performed in any desired order.

Figure 5D:
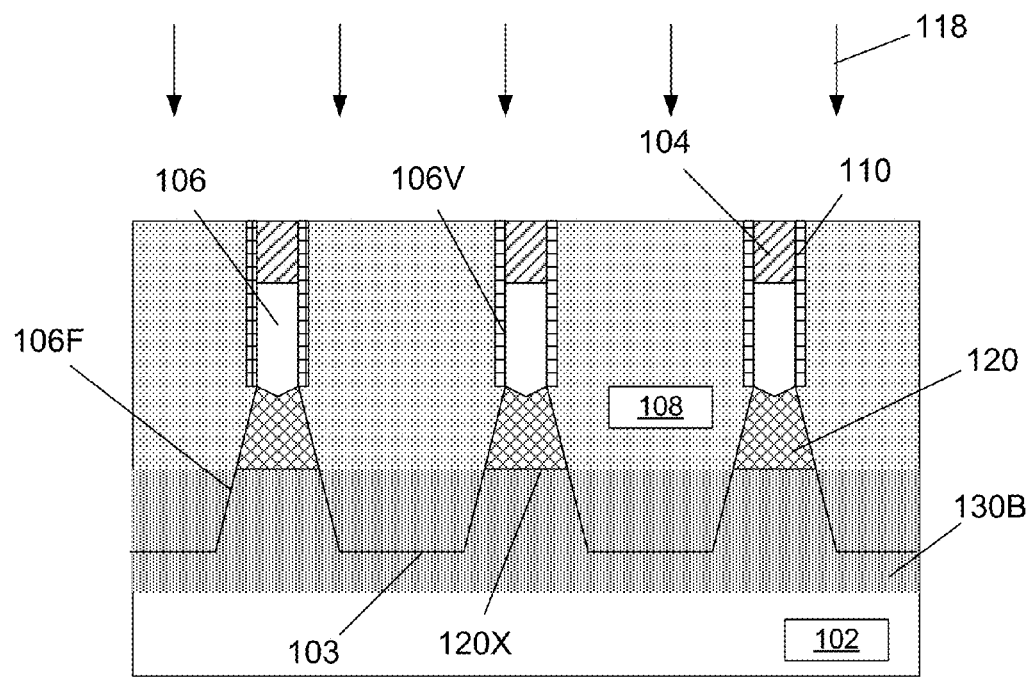

FIG. 5D depicts the product 100 after the above-described thermal anneal process 118 was performed on the product 100 so as to form oxide fin isolation regions 120 under each of the fins 106.

Figure 5E:
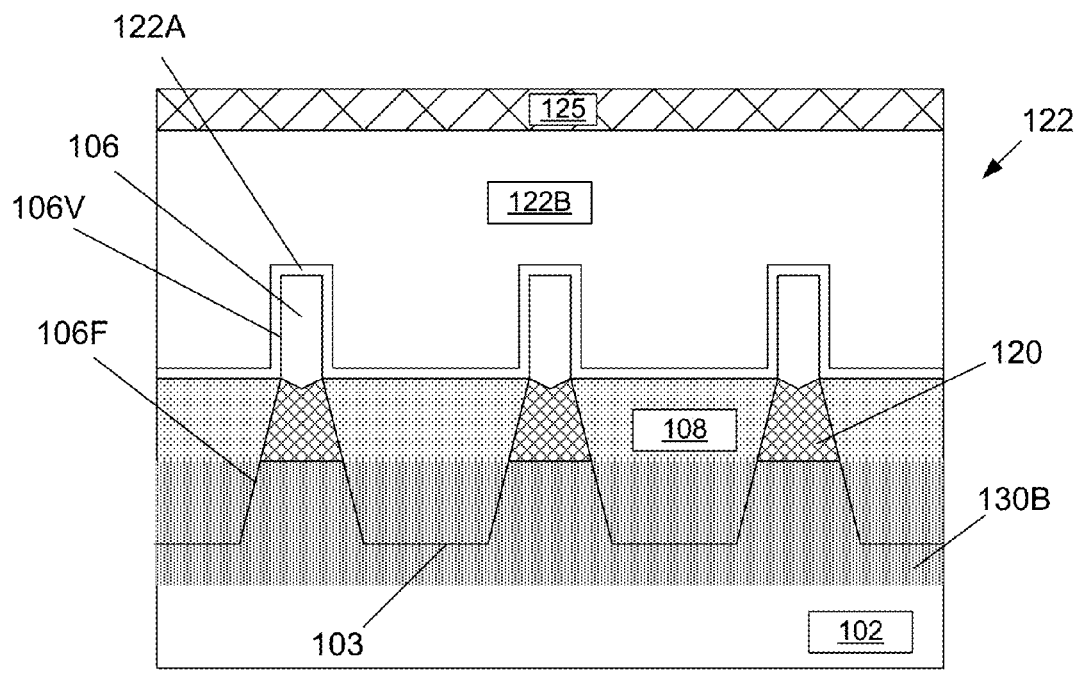

At this point in the process flow, traditional manufacturing techniques may be performed to complete the fabrication of the FinFET devices for the product 100. FIG. 5E depicts the product 100 after several process operations were performed. First, a recess ("etch-back") etching process was performed to recess the layer of insulating material 108 between the fins 106 so as to expose the desired final height of the fins 106. Next, one or more etching processes were performed to remove the patterned mask layer 104 and the spacers 110 and thereby expose the upper portions of the fins 106. At this point, the above-described gate structures 122 (either final or dummy gates structures) and gate cap layer 125 may be formed for the FinFET devices.

Figure 6A:
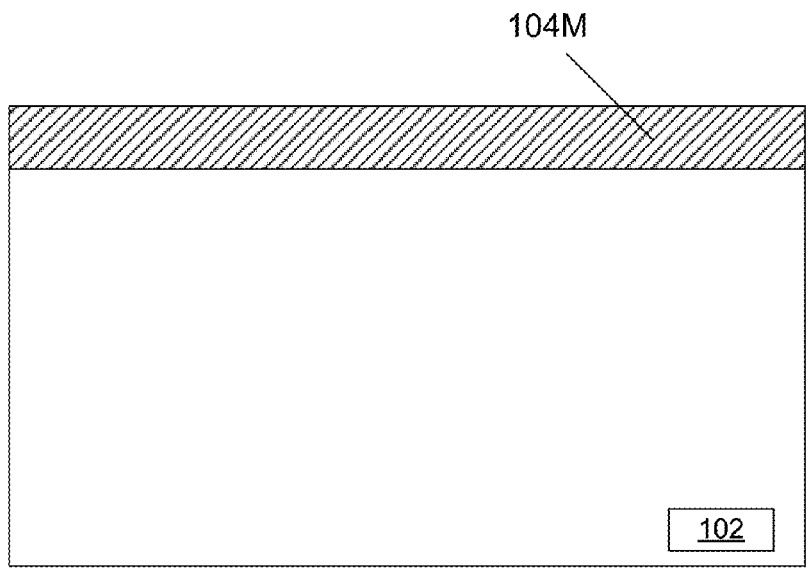
FIGS. 6A-6F depict yet an additional illustrative method disclosed herein of forming fin isolation regions for FinFET semiconductor devices.

FIGS. 6A-6F depict yet another illustrative method disclosed herein of forming fin isolation regions for FinFET semiconductor devices. FIG. 6A depicts the product 100 after a layer 104M comprised of the material(s) for the patterned hard mask was formed above the substrate 102.

Figure 6B:
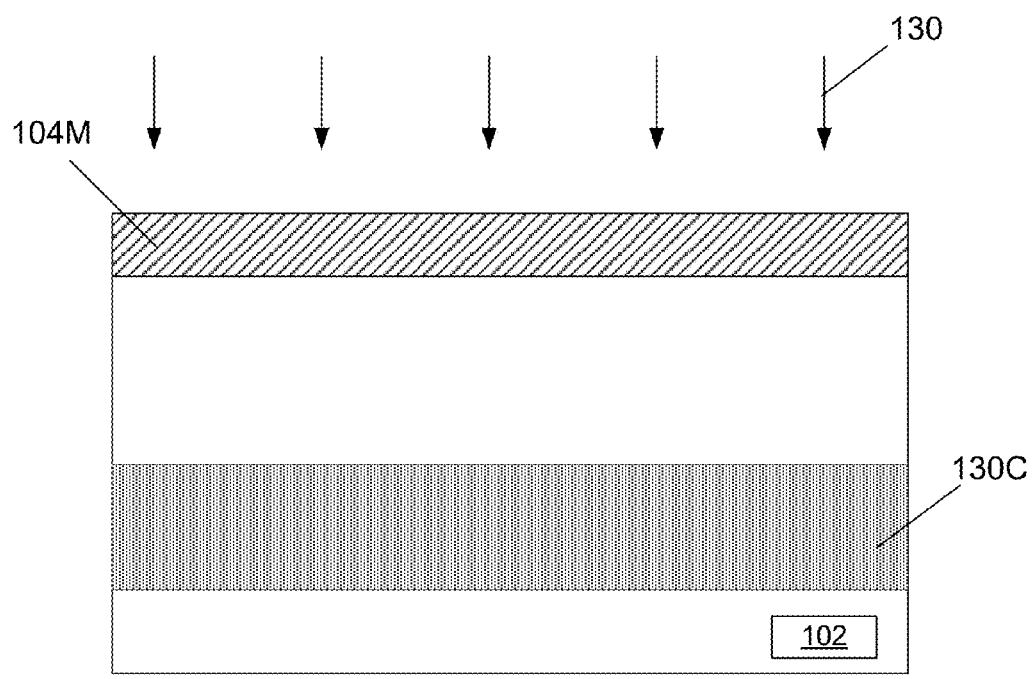

FIG. 6B depicts the product 100 after the above-described oxidation-retarding implantation process 130 was performed to form an implant region 130C in the substrate 102. In this embodiment, the implant region 130C is formed such that it is positioned at a depth in the substrate 102 such that a portion of the tapered sidewalls 106F of the fins 106, once they are formed in the substrate 102, will include the implant region 130C.

Figure 6C:
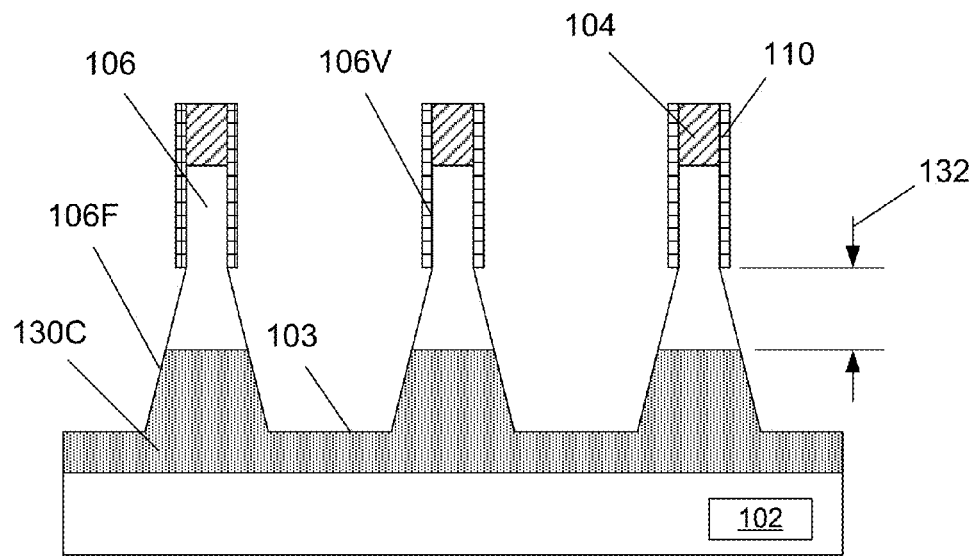

FIG. 6C depicts the product 100 after several process operations were performed. First, the layer 104M was patterned so as to define the patterned masking layer 104. Then, the above-described fin-formation trenches 103 were formed in the substrate 102 by performing an etching process through the patterned masking layer 104. This results in the formation of the three illustrative fins 106 that include at least a portion of the implant region 130C. As before, the distance 132 between the upper surface of the implant region 130C and the bottom of the spacers 110 will correspond approximately to the thickness (or height) of the above-described oxide fin isolation regions 120.

Figure 6D:
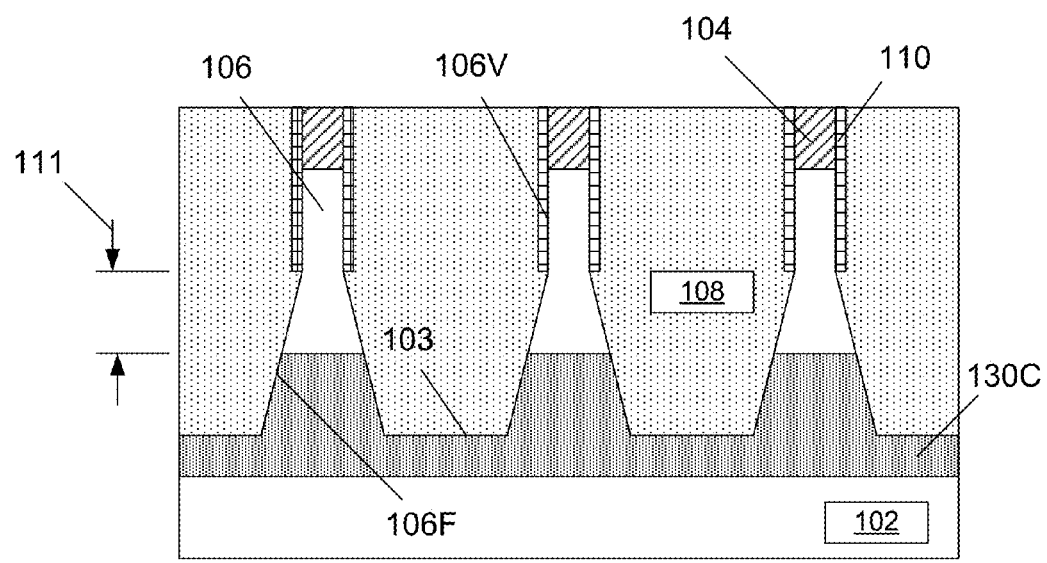

FIG. 6D depicts the product 100 after several process operations were performed. First, the above-described layer of insulating material 108, such as an HDP silicon dioxide material, was formed in the trenches 103 between the fins 106. The layer of insulating material 108 was initially formed such that it over-filled the trenches 103. Thereafter, a CMP process was performed that stopped on the patterned hard mask 104. Moreover, if desired, the above-described oxidation-enhancing ion implantation process may be performed to introduce an oxidation-enhancing material into the layer of insulating material 108 in the region 111.

Figure 6E:
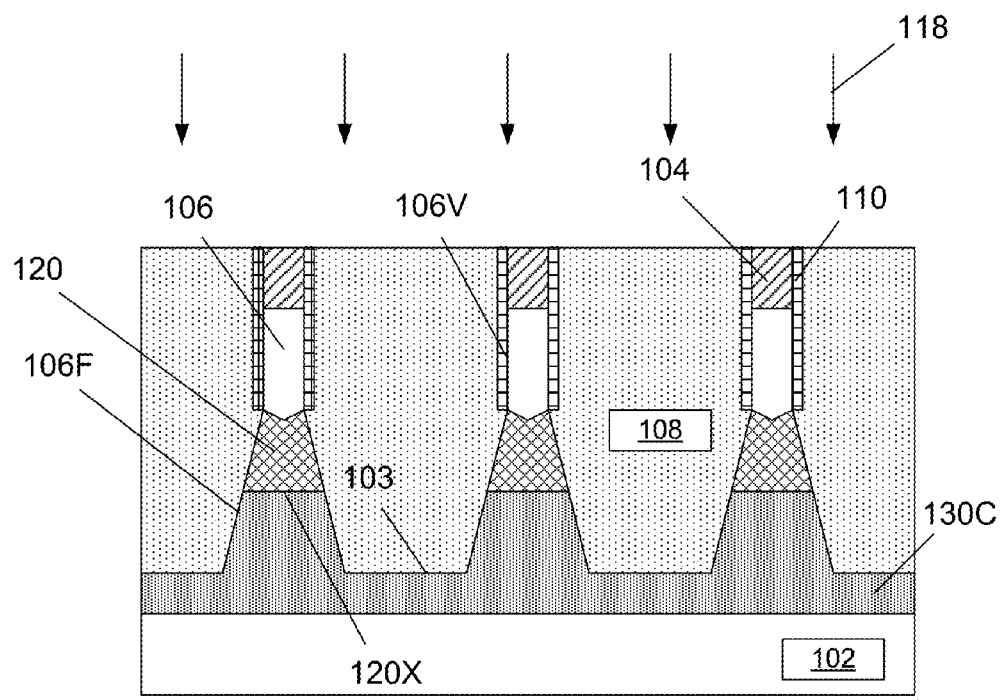

FIG. 6E depicts the product 100 after the above-described thermal anneal process 118 was performed on the product 100 so as to form oxide fin isolation regions 120 under each of the fins 106.

Figure 6F:
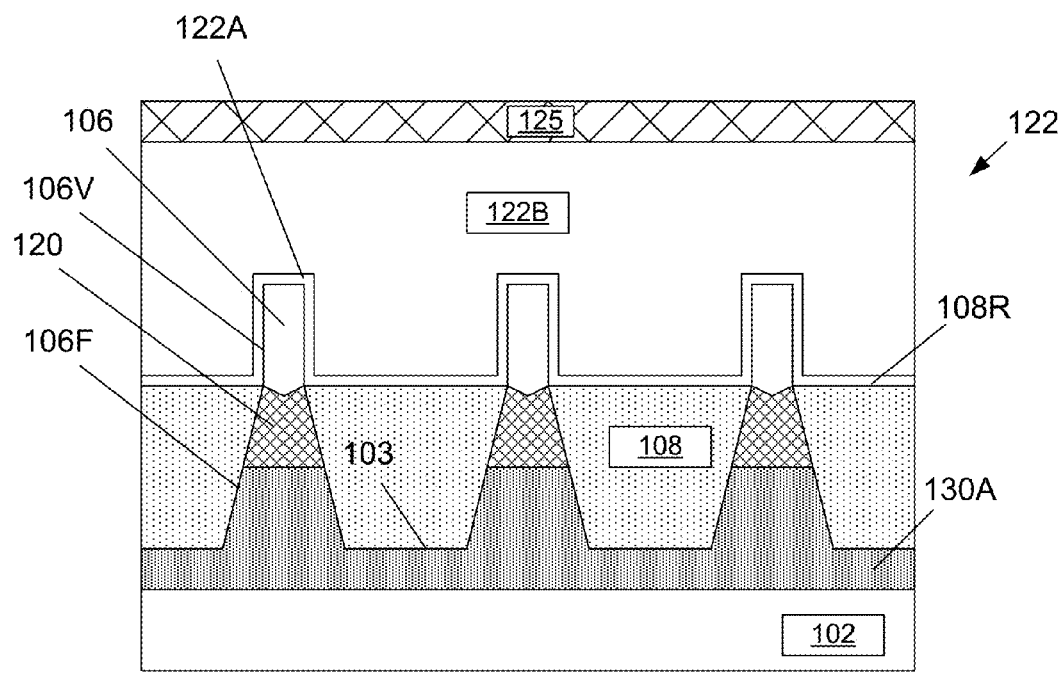

At this point in the process flow, traditional manufacturing techniques may be performed to complete the fabrication of the FinFET devices for the product 100. FIG. 6F depicts the product 100 after several process operations were performed. First, a recess ("etch-back") etching process was performed to recess the layer of insulating material 108 between the fins 106 so as to expose the desired final height of the fins 106. Next, one or more etching processes were performed to remove the patterned mask layer 104 and the spacers 110 and thereby expose the upper portions of the fins 106. At this point, the above-described gate structures 122 (either final or dummy gates structures) and gate cap layer 125 may be formed for the FinFET devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of fin-formation trenches in a semiconductor substrate so as to define a fin comprising sidewalls, a lower portion and an upper portion;
    forming a first oxidation-blocking layer of insulating material in said trenches so as to cover a portion, but not all, of the sidewalls of said lower portion of said fin;
    forming a second layer of insulating material above said first oxidation-blocking layer of insulating material and on a portion of said lower portion of said fin; and
    performing a thermal anneal process,
    wherein, after said thermal anneal process, a part, but not all, of said lower portion of said fin positioned above said first oxidation-blocking layer of insulating material is converted into an oxide fin isolation region positioned under said upper portion of said fin.

2. The method of claim 1, further comprising, after forming said oxide fin isolation region, forming a gate structure comprised of a gate insulation layer and a gate electrode around a portion of said fin positioned above said oxide fin isolation region.

3. The method of claim 1, wherein said oxide fin isolation region is comprised of silicon dioxide.

4. The method of claim 1, wherein said first oxidation-blocking layer of insulating material is made of silicon nitride or silicon oxynitride.

5. The method of claim 1, wherein said performing said thermal anneal process comprises performing an anneal process at a temperature that falls within a range of about 400-1300° C. in an oxidizing ambient.

6. The method of claim 1, wherein said forming said first oxidation-blocking layer of insulating material comprises performing a deposition process so as to form said first oxidation-blocking layer of insulating material such that an as-deposited upper surface of said first oxidation-blocking layer of insulating material is positioned so as to cover a portion, but not all, of said tapered sidewalls of said lower portion of said fin.

7. The method of claim 1, wherein said forming said first oxidation-blocking layer of insulating material comprises:
    performing a deposition process so as to over-fill said trenches with said first oxidation-blocking layer of insulating material;
    performing a planarization process on said deposited first oxidation-blocking layer of insulating material; and
    performing a recess etching process on said first oxidation-blocking layer of insulating material.

8. A method, comprising:
    forming a plurality of fin-formation trenches in a semiconductor substrate so as to define a fin comprised of a lower portion and an upper portion, wherein said lower portion of said fin has tapered sidewalls;
    forming a first oxidation-blocking layer of insulating material in said trenches so as to cover a portion, but not all, of the sidewalls of said lower portion of said fin;
    forming a first layer of insulating material in said fin-formation trenches above said first oxidation-blocking layer of insulating material and on and in contact with a portion of said lower portion of said fin;

forming a sidewall spacer on opposite sides of said upper portion of said fin above an upper surface of said first layer of insulating material;

forming a second layer of insulating material above said first layer of insulating material and adjacent said sidewall spacers; and performing a thermal anneal process, wherein, after said thermal anneal process, said portion of said lower portion of said fin that is in contact with said first insulating material is converted into an oxide fin isolation region positioned under said upper portion of said fin.

9. The method of claim 8, wherein said oxide fin isolation region is comprised of silicon dioxide.

10. The method of claim 8, wherein said first oxidation-blocking layer of insulating material is made of silicon nitride or silicon oxynitride.

11. The method of claim 8, wherein said performing said thermal anneal process comprises performing an anneal process at a temperature that falls within a range of about 400-1300° C. in an oxidizing ambient.

12. The method of claim 8, wherein said forming said first oxidation-blocking layer of insulating material comprises performing a deposition process so as to form said first oxidation-blocking layer of insulating material such that an as-deposited upper surface of said first oxidation-blocking layer of insulating material is positioned so as to cover a portion, but not all, of said tapered sidewalls of said lower portion of said fin.

13. The method of claim 8, wherein said forming said first oxidation-blocking layer of insulating material comprises:

performing a deposition process so as to over-fill said trenches with said first oxidation-blocking layer of insulating material;

performing a planarization process on said deposited first oxidation-blocking layer of insulating material; and performing a recess etching process on said first oxidation-blocking layer of insulating material.

14. A method, comprising:

forming a plurality of fin-formation trenches in a semiconductor substrate so as to define a fin comprised of a lower portion and an upper portion, wherein said lower portion of said fin comprises tapered sidewalls;

forming a first oxidation-blocking layer of insulating material in said trenches so as to cover a portion, but not all, of the tapered sidewalls of said lower portion of said fin, wherein said first oxidation-blocking layer of insulating material comprises one of silicon nitride or silicon oxynitride;

forming a first layer of insulating material in said fin-formation trenches above said first oxidation-blocking layer of insulating material and on and in contact with a portion of the tapered sidewalls of said lower portion of said fin, wherein the first layer of insulating material comprises silicon dioxide;

forming a sidewall spacer on opposite sides of said upper portion of said fin above an upper surface of said first layer of insulating material;

forming a second layer of insulating material above said first layer of insulating material and adjacent said sidewall spacers; and performing a thermal anneal process at a temperature that falls within a range of about 400-1300° C. in an oxidizing ambient, wherein, after said thermal anneal process, said portion of said lower portion of said fin that is in contact with said first insulating material is converted into an oxide fin isolation region positioned under said upper portion of said fin.

15. The method of claim 14, wherein said forming said first oxidation-blocking layer of insulating material comprises performing a deposition process so as to form said first oxidation-blocking layer of insulating material such that an as-deposited upper surface of said first oxidation-blocking layer of insulating material is positioned so as to cover a portion, but not all, of said tapered sidewalls of said lower portion of said fin.

16. The method of claim 14, wherein said forming said first oxidation-blocking layer of insulating material comprises:

performing a deposition process so as to over-fill said trenches with said first oxidation-blocking layer of insulating material;

performing a planarization process on said deposited first oxidation-blocking layer of insulating material; and performing a recess etching process on said first oxidation-blocking layer of insulating material.

\* \* \* \* \*